US009247664B2

(12) United States Patent
Takizawa

(10) Patent No.: US 9,247,664 B2
(45) Date of Patent: Jan. 26, 2016

(54) ELECTRONIC DEVICE AND MANUFACTURING METHOD THEREOF, ELECTRONIC APPARATUS, AND MOVING BODY

(71) Applicant: Seiko Epson Corporation, Tokyo (JP)

(72) Inventor: Teruo Takizawa, Matsumoto (JP)

(73) Assignee: Seiko Epson Corporation (JP)

( * ) Notice: Subject to any disclaimer, the term of this patent is extended or adjusted under 35 U.S.C. 154(b) by 389 days.

(21) Appl. No.: 13/855,035

(22) Filed: Apr. 2, 2013

(65) Prior Publication Data

US 2013/0265701 A1 Oct. 10, 2013

(30) Foreign Application Priority Data

Apr. 4, 2012 (JP) ................. 2012-085863
Feb. 15, 2013 (JP) ................. 2013-028186

(51) Int. Cl.
| | |
|---|---|
| G01C 19/56 | (2012.01) |
| G01P 1/02 | (2006.01) |
| H05K 5/06 | (2006.01) |
| H05K 13/00 | (2006.01) |
| G01C 19/5719 | (2012.01) |
| G01P 15/097 | (2006.01) |
| G01P 15/125 | (2006.01) |
| G01C 19/5747 | (2012.01) |
| B81B 7/00 | (2006.01) |
| B81B 7/02 | (2006.01) |

(52) U.S. Cl.
CPC .............. *H05K 5/069* (2013.01); *B81B 7/0041* (2013.01); *B81B 7/02* (2013.01); *G01C 19/5719* (2013.01); *G01C 19/5747* (2013.01); *G01P 15/097* (2013.01); *G01P 15/125* (2013.01); *H05K 13/00* (2013.01); *B81C 2203/0145* (2013.01); *Y10T 29/49002* (2015.01)

(58) Field of Classification Search
CPC .................. B81C 1/00293; G01C 19/5783
USPC .................................. 73/493, 510
See application file for complete search history.

(56) References Cited

U.S. PATENT DOCUMENTS

| | | | |
|---|---|---|---|
| 7,004,025 B2 | 2/2006 | Tamura | |
| 7,250,353 B2 | 7/2007 | Nasiri et al. | |
| 7,458,263 B2 | 12/2008 | Nasiri et al. | |
| 8,035,209 B2* | 10/2011 | Gonska et al. | 257/682 |
| 8,342,021 B2* | 1/2013 | Oshio | 73/493 |

FOREIGN PATENT DOCUMENTS

JP 2002005950 A 1/2002

\* cited by examiner

*Primary Examiner* — John Chapman, Jr.
(74) *Attorney, Agent, or Firm* — Harness, Dickey & Pierce, P.L.C.

(57) ABSTRACT

An electronic device includes a substrate, a cover body which is placed on the substrate, a first cavity which is surrounded by the substrate and the cover body, and a second cavity which is surrounded by the substrate and the cover body, wherein an inner portion of the first cavity is sealed in a first air pressure atmosphere, and an inner portion of the second cavity is sealed in a second air pressure atmosphere which has a difference of air pressure with respect to the first air pressure atmosphere, a first through-hole, which communicates with the first cavity and is blocked by a seal member, is provided in at least one of the substrate and the cover body, and the first cavity and the second cavity are isolated from each other by a partition wall portion which is integrally provided to the cover body or the substrate.

20 Claims, 18 Drawing Sheets

ELECTRONIC DEVICE AND MANUFACTURING METHOD THEREOF, ELECTRONIC APPARATUS, AND MOVING BODY

BACKGROUND

1. Technical Field

The present invention relates to an electronic device and a manufacturing method thereof, an electronic apparatus, and a moving body.

2. Related Art

Recently, for example, an electronic device such as an inertial sensor, which detects physical quantity using technology of silicon Micro Electro Mechanical System (MEMS), has been developed. In JP-A-2002-5950, for example, an electronic device (combined sensor element) which includes an angular velocity sensor and an acceleration sensor is disclosed. For example, the above-described electronic device is used for a camera shake correction function of a digital still camera (DSC), a navigation system of an automobile, an operation input device at a game machine, or the like.

In this way, according to the electronic device in which a plurality of physical quantity detection sensors are mounted into the same package (the same substrate), it is possible to meet demands for size reduction and space saving. Moreover, since a process which electrically connects the substrates, on which sensors are mounted, by lamination or the like can be omitted, it can contribute to simplification of the production process and reduction of the production cost.

In the above-described electronic device, since the acceleration sensor is designed considering viscosity (damping) which is generated between inertial mass and atmospheric pressure, the acceleration sensor is sealed at an atmospheric pressure atmosphere. On the other hand, since gas viscosity becomes a cause which damps vibration when air (or other gas and the like) exists, the angular velocity sensor is sealed at a decompression atmosphere such as a vacuum atmosphere. According to this, since cavities, in which the inner pressures are different from each other in the same package, are formed, when bonding reliability between members is decreased, airtightness of the cavities is decreased, and disadvantages occur in the electronic device. In the combined sensor element disclosed in JP-A-2002-5950, a base and a division wall portion, and the division wall portion and a cover member are bonded to each other respectively, and thus, airthightness of cavities is secured. In this case, since the plurality of bonded portions exist, if a second bonding is performed after a first bonding is performed, there is a concern that the first bonding state may be unstable, and it is difficult to secure bonding reliability between each member. From the above, in the above-described electronic device, an electronic device having improved reliability and a manufacturing method thereof are required.

SUMMARY

An advantage of some aspects of the invention is to provide an electronic device having improved reliability. Another advantage of some aspects of the invention is to provide a manufacturing method of the electronic device. Still another advantage of some aspects of the invention is to provide an electronic apparatus and a moving body which include the electronic device.

The invention can be implemented as the following embodiments or application examples

Application Example 1

This application example is directed to an electronic device including: a substrate; a cover body which is placed on the substrate; a first function element which is provided in a first cavity which is surrounded by the substrate and the cover body; and a second function element which is provided in a second cavity which is surrounded by the substrate and the cover body, wherein an inner portion of the first cavity is sealed in a first air pressure atmosphere, and an inner portion of the second cavity is sealed in a second air pressure atmosphere which has a difference of air pressure with respect to the first air pressure atmosphere, a first through-hole, which communicates with the first cavity and is blocked by a seal member, is provided in at least one of the substrate and the cover body, and the first cavity and the second cavity are isolated from each other by a partition wall portion which is integrally provided to the cover body or the substrate.

In an electronic device in which cavities having inner pressures different from each other are formed in the same package, when airtightness of the cavities is decreased, defects occur in the function elements accommodated in the cavities, and there is a concern that reliability of the electronic device itself may be decreased. Therefore, it is necessary to securely isolate each cavity and secure high airtightness of the cavities.

According to the electronic device according to the application example, the first cavity and the second cavity are isolated from each other by the partition wall portion which is integrally provided in the cover body or the substrate. According to this, the first cavity and the second cavity are configured by only two members of the substrate and the cover body without a seal member. In other words, the bond interface between members, which is required for configuring two cavities in the same package, includes only the bond surface between the substrate and the cover body. Therefore, compared to an electronic device in which a partition wall member other than the substrate and the cover body isolates between the cavities having inner pressures different from each other, an electronic device having improved reliability can be provided.

Application Example 2

The electronic device according to the application example may include a second through-hole, which communicates with the second cavity and is blocked by a seal member.

According to the electronic device of this application example, since the through-hole is provided in the first cavity and the second cavity in at least one of the substrate and the cover body, the air pressure atmosphere of each cavity can be set to the air pressure atmosphere which is different from the air pressure atmosphere in which the cover body and the substrate are bonded.

Application Example 3

The electronic device according to the application example may be configured such that the first through-hole does not overlap with the first function element and the second function element in a plan view of the electronic device.

Application Example 4

The electronic device according to the application example may be configured such that the first through-hole and the second through-hole do not overlap with the first function element and the second function element in a plan view of the electronic device.

According to the electronic device of the application example, splash (spray), which is generated at a time in the sealing process when the seal members are melted, cannot easily influence the first and second function elements, and thus, reliability of the electronic device can be improved.

Application Example 5

The electronic device according to the application example may be configured such that a material of the substrate is glass and a material of the cover body is silicon.

Application Example 6

The electronic device according to the application example may be configured such that the first function element detects physical quantities different from the second function element.

Application Example 7

This application example is directed to a manufacturing method of an electronic device, including: placing a first function element and a second function element on a substrate; placing a cover body on the substrate, accommodating the first function element in a first cavity which is surrounded by the substrate and the cover body, and accommodating the second function element in a second cavity which is surrounded by the substrate and the cover body; and sealing the first cavity in a first air pressure atmosphere and sealing the second cavity in a second air pressure atmosphere which has a difference of air pressure with respect to the first air pressure atmosphere, wherein the first cavity and the second cavity are isolated from each other by a partition wall portion which is integrally provided to the cover body or the substrate.

According to the manufacturing method of the electronic device of this application example, the first cavity and the second cavity are isolated from each other by the partition wall portion which is integrally provided in the cover body or the substrate. According to this, it is not necessary to separately prepare a member for isolating the cavities so as to bond the cover body and the substrate. Therefore, the manufacturing process is more simplified, and the manufacturing method which can manufacture the electronic device having more improved reliability can be provided.

Application Example 8

The manufacturing method of the electronic device according to the application example may be configured such that a first through-hole which communicates with the first cavity and a second through-hole which communicates with the second cavity are provided in at least one of the substrate and the cover body, the sealing includes a first sealing of sealing the first cavity by blocking the first through-hole by a seal member in the first air pressure atmosphere, and a second sealing of sealing the second cavity by blocking the second through-hole by a seal member in the second air pressure atmosphere after the first sealing, and the first air pressure atmosphere is air pressure lower than the second air pressure atmosphere.

According to the manufacturing method of the electronic device of this application example, after the first cavity is sealed under the first air pressure atmosphere, the second cavity is sealed under the second air pressure atmosphere which is air pressure higher than the first air pressure atmosphere. According to this, the pressure of the direction toward the inside of first cavity can be applied to the package of the electronic device under the second air pressure atmosphere. Thereby, adhesiveness of the seal member which blocks the first through-hole and adhesiveness between the cover body and the substrate are improved, and an electronic device having more improved reliability can be provided.

Application Example 9

The manufacturing method of the electronic device according to the application example may be configured such that a through-hole which communicates with the first cavity is provided in at least one of the substrate and the cover body, and the sealing includes a first sealing of sealing the second cavity in the second air pressure atmosphere by performing the placing and the accommodating in the second air pressure atmosphere, and a second sealing of sealing the first cavity by blocking the through-hole by the seal member in the first air pressure atmosphere after the first sealing.

According to the manufacturing method of the electronic device of this application example, the sealing of the cavity with which the through-hole does not communicate can be performed in the placing and the accommodating. According to this, the material costs of the seal member which is formed of alloy such as AuGe are reduced, and the sealing process of the through-hole, which requires a temperature control having high accuracy, can be simplified. Therefore, the manufacturing method of the electronic device, which can contribute to reduction of the production costs and simplification of the production processes, can be provided.

In addition, according to the manufacturing method of the electronic device of this application example, in the sealing which seals two cavities, the sealing of sealing the through-hole by the seal member is once, and it is not necessary to heat the package plural times. According to this, it is possible to prevent the seal member from being remelted due to the plurality of times of sealing and airtightness from being decreased. Accordingly, compared to the manufacturing method of the electronic device in which the plurality of times of sealing is performed in the same package, the manufacturing method, in which the electronic device having higher reliability is manufactured, can be provided.

Application Example 10

The manufacturing method of the electronic device according to the application example may be configured such that the second air pressure atmosphere is air pressure lower than the first air pressure atmosphere.

According to the manufacturing method of the electronic device of this application example, after the second cavity is sealed under the second air pressure atmosphere, the first cavity is sealed under the first air pressure atmosphere which is air pressure higher than the second air pressure atmosphere. According to this, the pressure of the direction toward the inside of second cavity can be applied to the package of the electronic device under the first air pressure atmosphere. Thereby, adhesiveness between the cover body and the substrate is improved, and an electronic device having more improved reliability can be provided.

Application Example 11

The manufacturing method of the electronic device according to the application example may be configured such that the second air pressure atmosphere is air pressure higher than the first air pressure atmosphere.

Application Example 12

The manufacturing method of the electronic device according to the application example may be configured such that a material of the substrate is glass and a material of the cover body is silicon.

Application Example 13

The manufacturing method of the electronic device according to the application example may be configured such that the first function element detects physical quantities different from the second function element.

Application Example 14

This application example is directed to an electronic apparatus including electronic devices according to the above-described Application Examples.

Application Example 15

This application example is directed to a moving body including the electronic device according to the application example.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. Moreover, the embodiments described below do not unjustly limit the contents described in aspects of the invention. In addition, all configurations described below are not essential constituent conditions of the invention.

1. Electronic Device
1-1. Configuration of Electronic Device

First Embodiment

Figure 1:
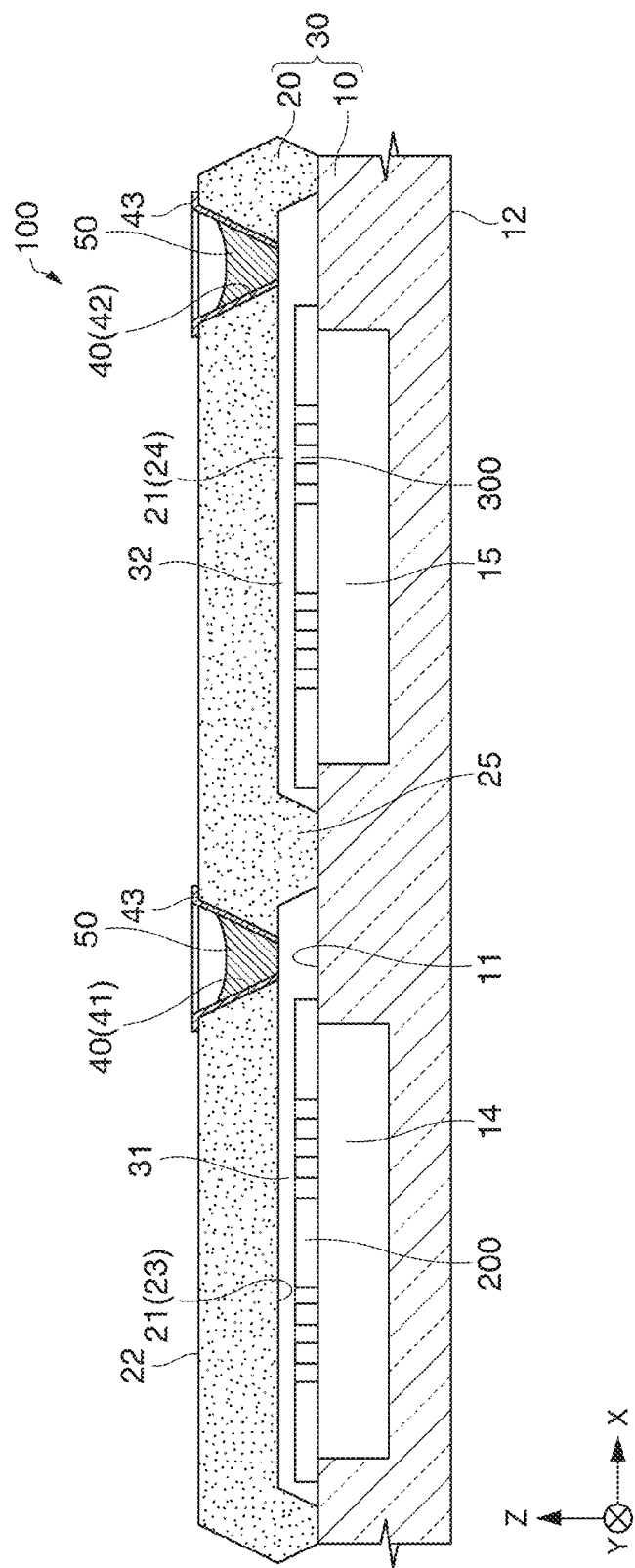
FIG. 1 is a cross-sectional view schematically showing an electronic device according to a first embodiment.

First, an electronic device according to a first embodiment will be described with reference the drawings. FIG. 1 is a cross-sectional view schematically showing an electronic device 100 according to the first embodiment. For convenience, in the drawings, an X axis, a Y axis, and a Z axis are shown as three axes perpendicular to one another.

As shown in FIG. 1, the electronic device 100 includes a package 30 which has a substrate 10 and a cover body 20, a through-hole 40 (41 and 42) which is provided in the package 30, a seal member 50 which seals the through-hole 40, and a first and second function elements 200 and 300 which are accommodated in the package 30. Moreover, for convenience, in FIG. 1, the first and second function elements 200 and 300 are shown so as to be simplified.

The first and second function elements 200 and 300, which are accommodated in the electronic device 100, are sensor elements which detect physical quantities different from each other respectively. That is, the first function element 200 is different from the second function element 300. Accordingly, the electronic device 100 is a combined sensor element in which a plurality of physical quantity detection sensors are mounted in the same package (the same substrate). Moreover, the details of the function elements are described below.

For example, as the substrate 10, a glass substrate, a silicon substrate, and a quartz substrate may be used. The substrate 10 includes a first surface 11 which is a surface of a side to which the cover body 20 is bonded, and a second surface 12 of a side opposite to the first surface 11. The substrate 10 supports the first and second function elements 200 and 300. More specifically, a first concave portion 14 and a second concave portion 15 are formed on the first surface 11 of the substrate 10, the first function element 200 is placed above the first concave portion 14, and the second function element 300 is placed above the second concave portion 15. Here, as shown in FIG. 1, the first function element 200 and the second function element 300 may be disposed so as to be adjacent to each other along an X axis direction. Due to the first concave portion 14 and the second concave portion 15, the first and second function elements 200 and 300 can move in only a desired direction without being interfered with the substrate 10.

The cover body 20 is placed on the substrate 10 and bonded to the substrate 10. In some cases, the cover body 20 may be bonded to only a portion of the first and second function elements 200 and 300. As shown in the drawings, the cover body 20 includes a first surface 21 in which a portion becomes a bond surface in the surface of the substrate 10 side, and a second surface 22 which defines a surface (outer surface) of the package 30 in the surface of the side opposite to the first surface 21.

A first concave portion 23 and a second concave portion 24 may be formed on the first surface 21 of the cover body 20. A first cavity 31 which accommodates the first function element 200 may be formed by the first concave portion 23 and the first surface 11 of the substrate 10. Therefore, the first concave portion 23 configures the inner wall of the first cavity 31. Moreover, a second cavity 32 which accommodates the second function element 300 may be formed by the second concave portion 24 and the first surface 11 of the substrate 10. Therefore, the second concave portion 24 configures the inner wall of the second cavity 32.

As shown in FIG. 1, a partition wall portion 25 which becomes a convex portion of the first surface 21 is formed between the first concave portion 23 and the second concave portion 24. Thereby, the first cavity 31 and the second cavity 32 can be spatially isolated from each other. Moreover, the tip surface of the partition wall portion 25, which is integrally provided to the cover body 20, becomes a bond surface to the substrate 10. Therefore, it is not necessary to separately provide a member for isolating the plurality of cavities. Since the first cavity 31 and the second cavity 32 are bonded to each other by a small bond surface, an isolation property can be increased.

Here, when a silicon substrate is used as the cover body 20, if a glass substrate is appropriately used as the substrate 10, the first surface 11 of the substrate 10 and the first surface 21 of the cover body 20 can use a bonding method such as an anodic bonding. For example, when a silicon substrate is used as the cover body 20, the through-hole 40 or the partition wall portion 25 which is integrally provided in the cover body 20 can be accurately formed using anisotropic etching by potassium hydroxide (KOH). This is because an etching rate of a (111) surface which is a crystal surface of a silicon is late, and a dimension control having high accuracy can be performed using the difference of the etching rate according to the crystal surface. On the other hand, when a glass substrate is used as the cover body 20, if a glass substrate is appropriately used as the substrate 10, the first surface 11 of the substrate 10 and the first surface 21 of the cover body 20 can use a bonding method such as a glass bonding.

Moreover, the bonding method between the substrate 10 and the cover body 20 is not particularly limited, and for example, a bonding such as an anodic bonding or a bonding by means of low-melting glass (glass paste) may be used, or a bonding by means of soldering may be used. In addition, a metallic thin film (not shown) is formed on the bonded portion of each of the substrate 10 and the cover body 20, and the substrate 10 and the cover body 20 may be bonded by eutectic-bonding the metallic thin films.

A planar shape (a shape when viewed in the Z axis direction) of the package 30 which includes the substrate 10 and the cover body 20 is not particularly limited if the package can accommodate the first and second function elements 200 and 300, and may be an oblong shape (more specifically, a rectangular shape), for example.

The first through-hole 41 which communicates with the first cavity 31 and the second through-hole 42 which communicates with the second cavity 32 are formed in at least one of the substrate 10 and the cover body 20. In the shown example, the first and second through-holes 41 and 42 are formed in the cover body 20. In the shown example, the first and second through-holes 41 and 42 penetrate the cover body 20 in the Z axis direction.

Here, as shown in FIG. 1, the first through-hole 41 and the second through-hole 42 may be disposed so as to have the same position relationship in the cover body 20. Due to the fact that the first through-hole 41 and the second through-hole 42 are disposed at equal intervals, since the pitch of the laser irradiation can be set at equal intervals, productivity can be improved.

Moreover, as shown in FIG. 1, the through-hole 40 may be disposed at a position which is not overlapped with the first and second function elements 200 and 300. That is, the through-hole 40 may be disposed outside the outer edges of the first and second function elements 200 and 300. According to this, splash (spray), which is generated at a time in the sealing process when the seal members 50 are melted, cannot easily influence the first and second function elements 200 and 300, and thus, reliability of the electronic device can be improved.

As shown in drawings, the inner wall surface of the through-hole 40 (first through-hole 41 and second through-hole 42) may be a taper shape. Specifically, the through-hole 40 may have a shape in which the opening area of the cavity side is smaller than the opening area of the outside. The planar shape (the shape when viewed in the Z axis direction) of the opening portion of the through-hole 40 is not particularly limited, and may be a circular shape or an oblong shape (for example, a square). For example, when the silicon substrate is used as the cover body 20, the silicon substrate is processed by anisotropic wet etching using potassium hydroxide (KOH), and the opening portion of the through-hole 40 can be formed in an oblong shape with more precision. For example, when a glass substrate is used for the cover body, as means for forming the through-hole, there are an isotropic wet etching method which uses hydrofluoric acid (HF), a blast method which sprays powder, and the like. In the isotropic wet etching method, not only the shape cannot be minutely controlled but also roughness occurs in the end surface. Moreover, in the blast method, the end portion is easily chipped. That is, the isotropic wet etching method and the blast method have difficulty as means for securing airtightness of the cavity. However, due to the fact that the silicon is used as the cover body, the difficulty can be solved. On the other hand, when a glass substrate is used as the cover body 20, the glass substrate is processed by isotropic wet etching using hydrofluoric acid (HF), and the opening portion of the through-hole 40 can be formed in a circular shape.

A conductive layer 43 may be formed on the inner wall surface of the through-hole 40. For example, as the conductive layer 43, a layer, in which a chrome layer and a gold layer are laminated in the above order from the side surface side of the through-hole 40, may be used. Due to the conductive layer 43, adhesiveness between the inner wall surface of the through-hole 40 and the seal member 50 can be improved.

The thickness of the conductive layer 43 is not particularly limited. However, for example, the thickness is approximately 30 nm to 200 nm.

In addition, the material of the conductive layer 43 may be appropriately changed according to the material of the seal member 50. Moreover, although not shown in the drawings, the conductive layer 43 may be formed on the entire surface of the cover body 20.

The seal member 50 is disposed in each of the first through-hole 41 and the second through-hole 42 and blocks the through-hole 40. The first cavity 31 and the second cavity 32 can be sealed respectively by the seal member 50. For example, the material of the seal member 50 is alloy such as AuGe, AuSi, AuSn, SnPb, PbAg, SnAgCu, or SnZnBi.

The seal state inside the first cavity 31 and the second cavity 32 which are sealed by the seal member 50 is appropriately selected according to the kind of the function element which is accommodated in the cavities. For example, when the first function element 200 is a vibration type gyro sensor, it is preferable that the first cavity 31 be a decompression state (more preferably, a vacuum state). Thereby, a vibration phenomenon of the gyro sensor can be suppressed from being damped by air viscosity. Moreover, for example, when the second function element 300 is an acceleration sensor, it is preferable that the second cavity 32 be an atmospheric pressure state and an inert gas atmosphere (for example, nitrogen gas). Thereby, a desired damping (viscosity) is generated between the inertial mass of the acceleration sensor and the atmosphere pressure, and an acceleration sensor having a predetermined detection sensitivity can be realized.

Moreover, in the shown example, the first concave portion 23 and the second concave portion 24, which become the first cavity 31 and the second cavity 32, are formed on the cover body 20. However, the concave portions may be formed on the substrate 10, the first function element 200 and the second function element 300 are accommodated respectively in two concave portions formed on the substrate 10, the concave portions are sealed by the cover body 20, and thus, the function elements may be accommodated. However, when the material of the substrate 10 is glass and the material of the cover body 20 is silicon, workability of MEMS of the cover body 20 is higher than that of the substrate 10. In other words, the cover body 20 is more easily processed than the substrate 10. Therefore, compared to the case where the concave portion which accommodates the function element is provided in the substrate 10 side, the electronic device in which workability is further improved can be provided.

Moreover, in the above-described example, the configuration is described in which the electronic device 100 according to the first embodiment can accommodate two function elements. However, the number of the function elements which are accommodated in the same package 30 is not particularly limited, a third cavity is further provided, and a third function element may be accommodated.

Second Embodiment

Figure 2:
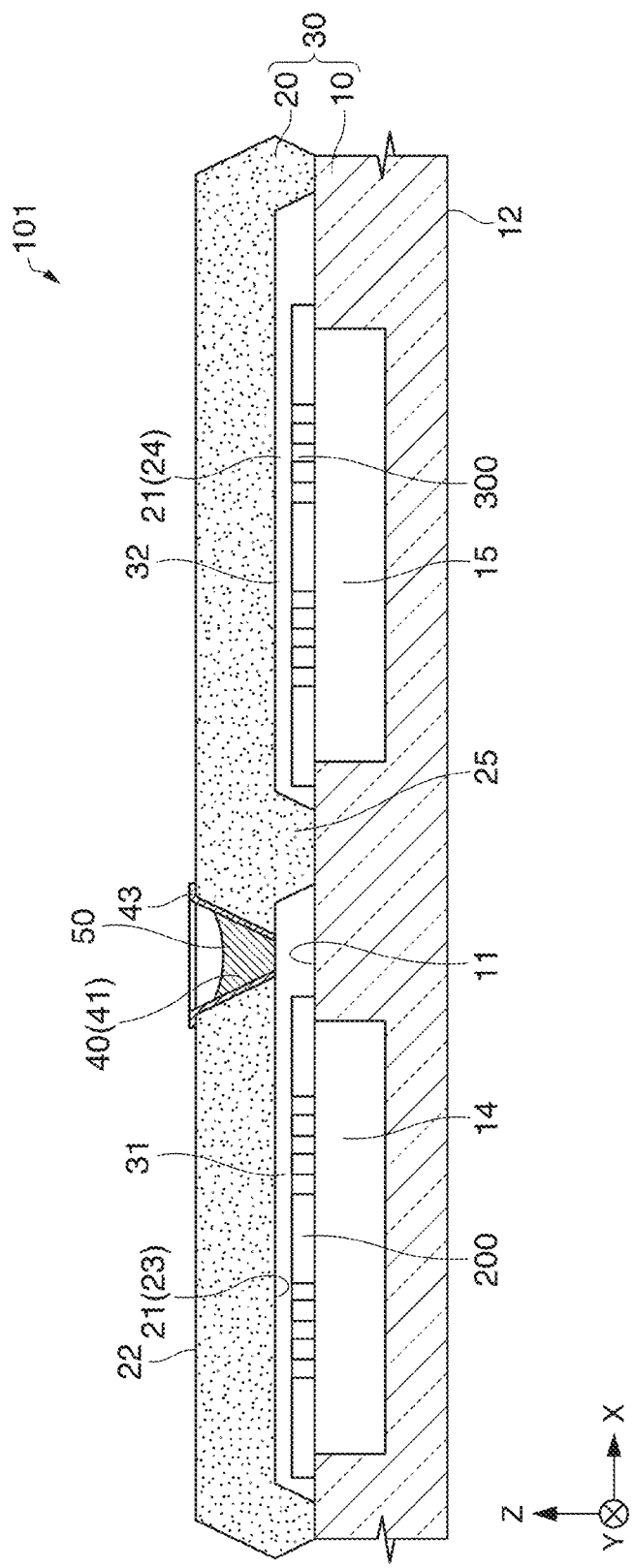
FIG. 2 is a cross-sectional view schematically showing an electronic device according to a second embodiment.
Figure 3:
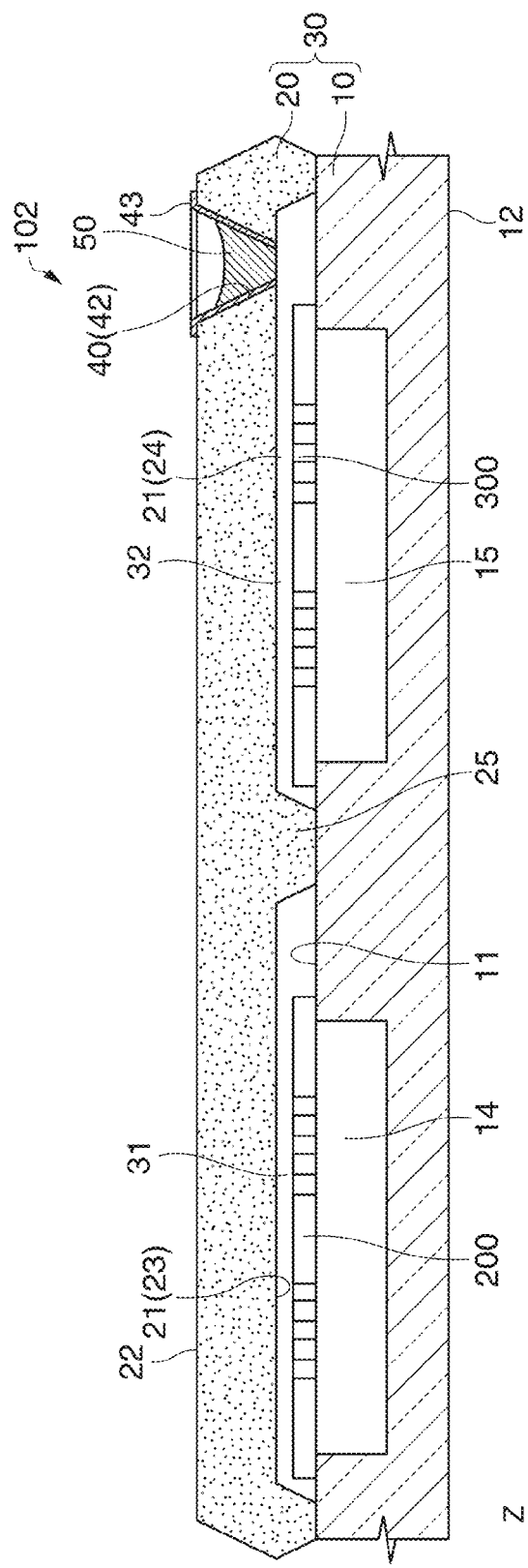
FIG. 3 is a cross-sectional view schematically showing the electronic device according to the second embodiment.

Next, an electronic device according to a second embodiment will be described with reference to the drawings. FIGS. 2 and 3 are cross-sectional views schematically showing electronic devices 101 and 102 according to the second embodiment. The electronic devices 101 and 102 according to the second embodiment are different from the electronic device 100 according to the first embodiment only in the configuration of the through-hole 40 (first through-hole 41 and second through-hole 42). In descriptions below, only matters in which the electronic devices 101 and 102 according to the second embodiment are different from the device 100 according to the first embodiment will be described. The same reference numerals are attached to the configurations which are previously described, and the detailed descriptions are omitted.

In the second embodiment, any one of the first through-hole 41 and the second through-hole 42 is provided. Accordingly, in the second embodiment, the through-hole which communicates with any one of the first cavity 31 and the second cavity 32 is not provided, and the inner surface of the cavity is configured only by the substrate 10 and the cover body 20.

For example, in the electronic device 101 according to the second embodiment, as shown in FIG. 2, only the first through-hole 41 which communicates with the first cavity 31 is provided, and the second through-hole 42 which communicates with the second cavity 32 is not provided. Moreover, in the electronic device 102 according to the second embodiment, as shown in FIG. 3, only the second through-hole 42 which communicates with the second cavity 32 is provided, and the first through-hole 41 which communicates with the first cavity 31 is not provided.

In the second embodiment, a process in which the cover body 20 is placed on the substrate 10 is performed under a desired air pressure atmosphere, and after the cavity with which the through-hole 40 does not communicate is sealed at the desired air pressure atmosphere, the through-hole 40 is blocked by the seal member under other air pressure atmosphere, and thus, the cavity with which the through-hole 40 communicates is sealed. Therefore, in the second embodiment, the cover body 20 is placed on the substrate 10 under the desired air pressure atmosphere in the cavity with which the through-hole 40 does not communicate.

Hereinafter, the bonding method between the substrate 10 and the cover body 20 when a gyro sensor described below is adopted as the first function element 200 accommodated in the first cavity 31 and an acceleration sensor (electrostatic capacitance type MEMS acceleration sensor element) described below is adopted as the second function element 300 accommodated in the second cavity 32 will be described. In the above case, the desired air pressure atmosphere of the first cavity 31 becomes a decompression atmosphere (for example, 10 Pa or less, and more preferably a vacuum atmosphere of 1 Pa or less), and the desired air pressure atmosphere of the second cavity 32 becomes an atmospheric pressure atmosphere.

As shown in FIG. 2, in the electronic device 101 in which the second through-hole 42 which communicates with the second cavity 32 is not provided, the bonding between the cover body 20 and the substrate 10 is performed at a second air pressure atmosphere (atmospheric pressure atmosphere) of the second cavity 32. Thereby, the second cavity 32 can be sealed at the atmospheric pressure atmosphere.

In the case of the electric device 101 shown in FIG. 2, in the bonding between the cover body 20 and the substrate 10, since the bonding is performed in the atmosphere, low-melting glass (not shown) which is stronger than the bonding by means of the anodic bonding is appropriately adopted. For example, when a lead glass material is used as the material of the low-melting glass, since the bonding in the atmosphere can be performed at low temperature (for example, approximately 320° C. to 360° C.), oxidative damage with respect to peripheral members such as wirings can be reduced during the bonding process.

In the sealing process of the first cavity 31 of the electronic device 101, for example, the atmosphere of the sealing process is set to a decompression state (preferably, a vacuum state) of 10 Pa or less, and the sealing is performed using the seal member 50. Heating and melting of the seal member 50 are performed by laser irradiation. In this case, the first cavity 31 is sealed under the decompression atmosphere in the state where the second cavity 32 is maintained to the atmospheric pressure. However, since the bonding by means of the low-melting glass is stronger than the bonding by means of the anodic bonding, the problem that the bonding strength is decreased does not occur.

Next, as shown in FIG. 3, in the electronic device 102 in which the first through-hole 41 which communicates with the first cavity is not provided, the bonding between the cover body 20 and the substrate 10 is performed at a first air pressure atmosphere (at decompression atmosphere, and more preferably, a vacuum atmosphere) of the first cavity 31. Thereby, the first cavity 31 can be sealed in the decompression atmosphere.

In the case of the electric device 102 shown in FIG. 3, in the bonding between the cover body 20 and the substrate 10, the anodic bonding (not shown) in which the strong bonding is possible even under the decompression atmosphere (for example, 10 Pa or less) is appropriately adopted. When the bonding by means of low-melting glass such as a lead glass material is performed under the decompression atmosphere, since oxygen which is needed in the adhesive response is not sufficiently supplied, there is a concern that time may be necessary for the adhesive response, or the bonding strength may be decreased due to the insufficient adhesive response. However, since the anodic bonding using a covalent bond can perform the bonding without receiving the influence of the decompression atmosphere, the bonding reliability of the anodic bonding is higher than the low-melting glass under the decompression atmosphere. Moreover, even when the material of the first function element and the second function element use a material in which oxidation should be avoided, since the bonding processing is performed under the decompression atmosphere, oxidative damages do not easily occur during the process.

In the sealing process of the second cavity 32 of the electronic device 102, the atmosphere of the sealing process is set to an atmospheric pressure state, and the second cavity 32 is sealed using the seal member 50. The heating and melting of the seal member 50 are performed by laser irradiation. In this case, since stress is generated from the outside toward the inside in the first cavity 31 which is sealed in the decompression atmosphere, the bonding strength between the substrate 10 and the cover body 20 can be increased.

In the case of the electronic device 102 shown in FIG. 3, the bonding between the substrate 10 and the cover body 20 may use leadless low-melting glass in addition to the anodic bonding.

Modification Example

Figure 4:
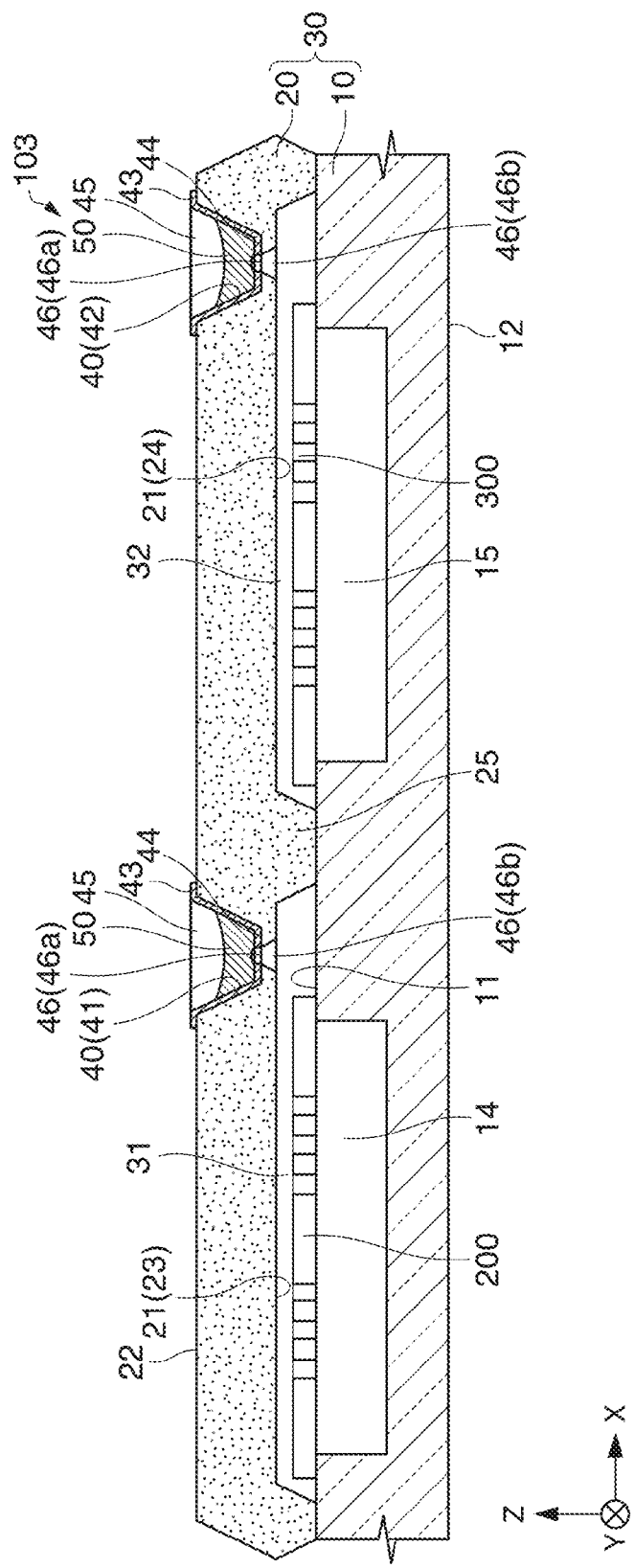
FIG. 4 is a cross-sectional view schematically showing a Modification Example of the electronic devices according to the first and second embodiments.

Next, Modification Example of the electronic device according to the first and second embodiments will be described with reference to drawings. FIG. 4 is a cross-sectional view schematically showing an electronic device 103 according to the Modification Example. The electronic device 103 according to the Modification Example is different from the electronic devices according to the first and second embodiments only in the configuration of the through-hole 40 (first through-hole 41 and second through-hole 42). In descriptions below, only matters which are different from the devices according to the first and second embodiments will be described. The same reference numerals are attached to the configurations which are previously described, and the detailed descriptions are omitted.

In the electronic device 103 according to the Modification Example, the through-hole 40 includes a bottom surface 44 and communicates with the cavity through a communication hole 46 provided on the bottom surface 44.

As shown in FIG. 4, the through-hole 40 includes a first opening 45 which is provided on the first surface 22 of the cover body 20. The first surface 22 of the cover body 20 is a surface of the cover body 20 and is a surface which forms the outline of the package 30. The first surface 22 of the cover body 20 is a surface of the side opposite to the second surface 24 of the cover body 20. The second surface 24 of the cover body 20 is a surface which defines the cavity 32 (the bottom of the concave portion which becomes the cavity).

The through-hole 40 has a shape in which the cross-sectional area (the area in the XY plane) is gradually increased from the bottom surface 44 toward the first opening 45. That is, the area of the first opening 45 is larger than the area of the bottom surface 44. The bottom surface 44 of the through-hole 40 is also referred to as the surface of the cover body 20 which defines the bottom of the through-hole 40. For example, the bottom surface 44 of the through-hole 40 is flat. In the shown example, the bottom surface 44 of the through-hole 40 is parallel to the first surface 22 of the cover body 20.

The through-hole 40 communicates with the cavity through the communication hole 46 which is formed on the bottom surface 44. The communication hole 46 includes a second opening 46a which is provided in a portion of the bottom surface 44 and a third opening 46b of the cavity side. The third opening 46b is provided on the second surface 24 of the cavity body 20. Moreover, the third opening 46b is not disposed at a position which is overlapped with the function elements 200 and 300 in a plan view as shown in FIG. 4. That is, the third opening 46b is disposed outside the outer edges of the function elements 200 and 300. The communication hole 46 has a shape in which the cross-sectional area (the area in the XY plane) is gradually increased from the second opening 46a toward the third opening 46b. That is, the area of the third opening 46b is larger than the area of the second opening 46a.

When the seal members such as a solder ball are melted in the through-holes 40 at a time by laser irradiation in the sealing process, there is a concern that spray referred to as splash may be diffused in the cavity. The spray may deteriorate resonance frequency or sensitivity of the function element which is accommodated in the electronic device.

On the other hand, according to the electronic device 103 in which the through-hole 40 includes the bottom surface 41 and communicates with the cavity by the communication hole 46 provided on the bottom surface 41, when the seal member disposed in the through-hole is melted and seals the cavity, a portion of the seal member can be suppressed from being scattered in the cavity and attached to the function element. As a result, the electronic device 103 can have improved characteristics. Accordingly, the electronic device 103 according to the Modification Example is applied to the through-holes 40 of the electronic devices 100, 101, and 102 according to the first and second embodiments, and thus, the electronic device having higher reliability can be provided.

1-2. Configuration of Function Element

The first and second function elements 200 and 300 are mounted on the substrate 10, and are placed (accommodated) respectively in the first cavity 31 and the second cavity 32 which are formed by the substrate 10 and the cover body 20 (are surrounded by the substrate 10 and the cover body 20). For example, the first and second function element 200 and 300 which are accommodated in the package 30 may be bonded to the substrate 10 by anodic bonding or direct bonding or by adhesive.

If the first and second function elements 200 and 300 detect physical quantities different from each other and move in the cavities which are sealed in a decompression state or an inert gas atmosphere, the aspects of the first and second function elements are not particularly limited and may include various function elements such as a gyro sensor, an acceleration sensor, vibrator, a surface acoustic wave (SAW) element, or a micro-actuator, for example.

For example, the materials of the first and second function elements 200 and 300 are silicon in which impurities such as phosphorus or boron are doped and thus, conductivity is applied.

Figure 5:
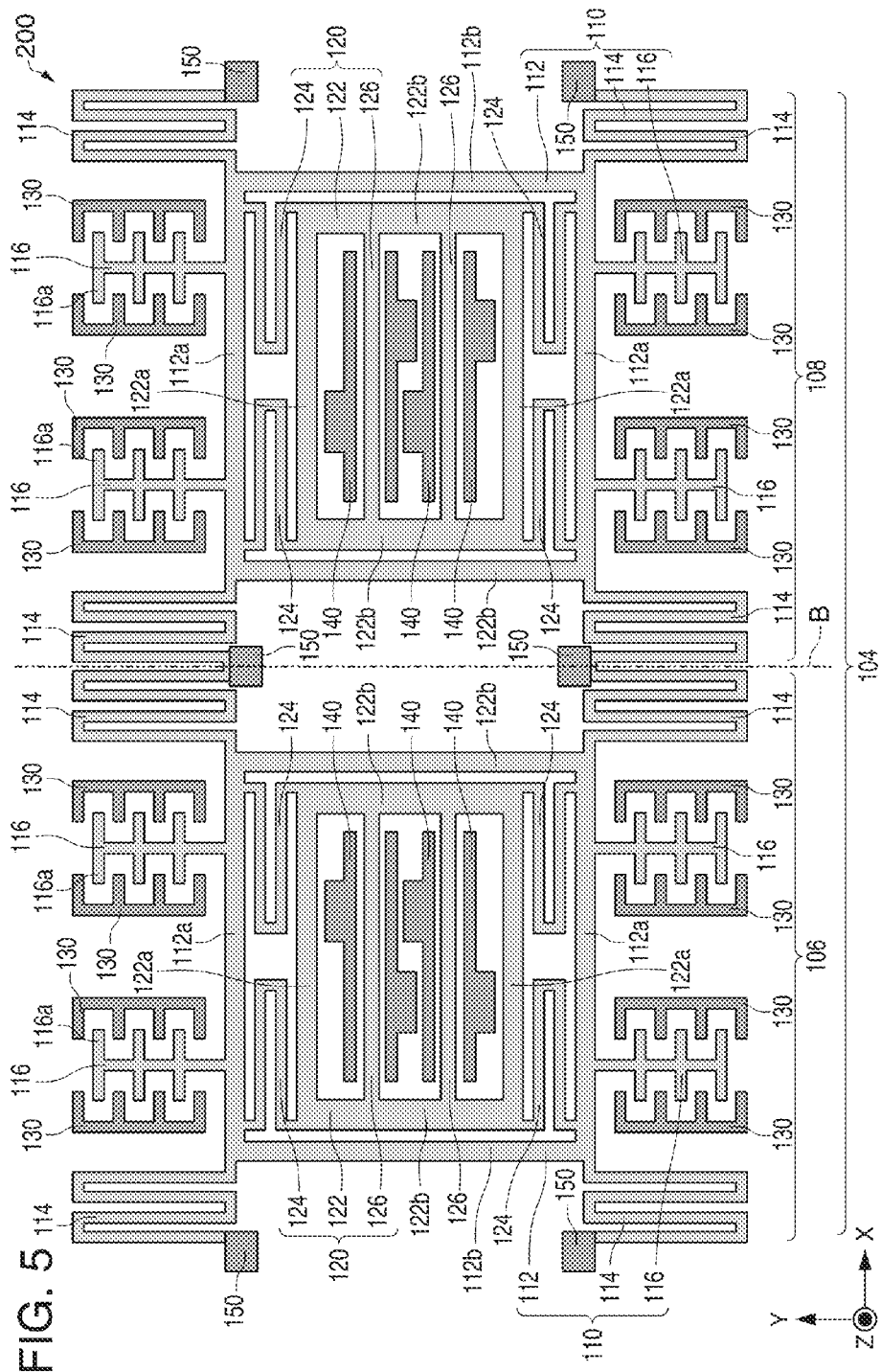
FIG. 5 is a plan view schematically showing an example of a first function element which is placed on the electronic device according to the present embodiment.

Hereinafter, as an example of the electronic device 100 according to the present embodiment, an aspect is described in which a gyro sensor is adopted as the first function element 200 and an acceleration sensor (electrostatic capacitance type MEMS acceleration sensor element) is adopted as the second function element 300. FIG. 5 is a plan view schematically showing the first function element 200 which is placed on the electronic device 100 according to the present embodiment. In addition, FIG. 10 is a plan view schematically showing the second function element 300 which is placed on the electronic device 100 according to the present embodiment. However, the aspects of the first and second function elements 200 and 300 are not limited to the following aspects and may include the aspects of the known function elements. Moreover, for convenience, in FIG. 5, the X axis, the Y axis, and the Z axis are shown as three axes perpendicular to one another. This is similarly applied to FIG. 6 to FIG. 10 described below.

Configuration of Gyro Sensor

As shown in FIG. 5, the first function element 200 may include a vibration system structure 104, fixed electrodes for driving 130, fixed electrode for detecting 140, and fixing portions 150.

For example, the vibration system structure 104 is integrally formed by processing a silicon substrate which is bonded to the substrate 10. Thereby, a fine process technology which is used in manufacturing of a silicon semiconductor device can be applied, and thus, the size reduction of the vibration system structure 104 can be improved.

The vibration system structure 104 is supported by the fixing portions 150 which are fixed to the substrate 10 and is disposed so as to be separated from the substrate 10. The vibration system structure 104 may include a first vibration body 106 and a second vibrating body 108. The first vibrating body 106 and the second vibrating body 108 are connected to each other along the X axis.

The first vibrating body 106 and the second vibrating body 108 may include shapes which are symmetrical with respect to a boundary line B (a straight line along the Y axis) of both. Therefore, hereinafter, the configuration of the first vibrating body 106 will be described, and the description of the configuration of the second vibrating body 108 will be omitted.

The first vibrating body 106 includes a drive portion 110 and a detection portion 120. The drive portion 110 may include a support portion for driving 112, a spring portion for driving 114, and a movable electrode for driving 116.

For example, the support portion for driving 112 has a frame-like shape, and the detection portion 120 is disposed inside the support portion for driving 112. In the shown example, the support portion for driving 112 is configured by first extension portions 112a which are extended along the X axis and second extension portions 112b which are extended along the Y axis.

The spring portion for driving 114 is disposed outside the support portion for driving 112. In the shown example, one end of the spring portion for driving 114 is connected to the vicinity of a corner portion (a connection portion between the first extension portion 112a and the second extension portion 112b) of the support portion for driving 112. The other end of the spring portion for driving 114 is connected to the fixing portion 150.

In the shown example, four spring portions for driving 114 are provided in the first vibrating body 106. Thereby, the first vibrating body 106 is supported by four fixing portions 150. In addition, the fixing portions 150 on the boundary line B between the first vibrating body 106 and the second vibrating body 108 may not be provided.

The spring portion for driving 114 has a shape which is extended along the X axis while reciprocating along the Y axis. The plurality of spring portions for driving 114 are provided so as to be symmetrical with respect to a virtual line (not shown) along the X axis passing through the center of the support portion for driving 112 and a virtual line (not shown) along the Y axis passing through the center of the support portion for driving 112. Since the spring portions for driving 114 have the above-described shape, the spring portions for driving 114 are suppressed from being deformed in the Y axis direction and the Z axis direction, and the spring portions for driving 114 can be smoothly expanded and contracted in the X axis direction which is a vibration direction of the drive portion 110. Moreover, according to the expansion and contraction of the spring portions for driving 114, the support portion for driving 112 (drive portion 110) can be vibrated along the X axis. In addition, the number of the spring portions for driving 114 is not particularly limited if the spring portion can vibrate the support portion for driving 112 along the X axis.

The movable electrode for driving 116 is disposed so as to be connected to the support portion for driving 112 outside the support portion for driving 112. More specifically, the movable electrode for driving 116 is connected to the first extension portion 112a of the support portion for driving 112.

The fixed electrode for driving 130 is disposed outside the support portion for driving 112. The fixed electrode for driving 130 is fixed on the substrate 10. In the shown example, the plurality of fixed electrodes for driving 130 are provided and disposed so as to be opposite to each other via the movable electrode for driving 116. In the shown example, each of the fixed electrodes for driving 130 has a comb-like shape, and each of the movable electrodes for driving 116 includes protrusions 116a which can be inserted between comb teeth of each of the fixed electrodes for driving 130. Due to the fact that the distances (gaps) between the fixed electrodes for driving 130 and the protrusions 116a are decreased, an electrostatic force, which is operated between the fixed electrodes for driving 130 and the movable electrode for driving 116, can be increased.

If voltage is applied to the fixed electrodes for driving 130 and the movable electrode for driving 116, an electrostatic force can be generated between the fixed electrodes for driving 130 and the movable electrode for driving 116. Thereby, the support portion for driving 112 (drive portion 110) can be vibrated along the X axis while spring portions for driving 114 are expanded and contracted along the X axis. At this time, since the vibration system structure 104 exists in a decompression atmosphere, particularly, in 10 Pa or less, efficiency of the vibration is increased.

Moreover, in the shown example, four movable electrodes for driving 116 are provided in the first vibrating body 106. However, the number of the movable electrodes is not particularly limited if the movable electrode can vibrate the support portion for driving 112 along the X axis. Moreover, in the shown example, the fixed electrodes for driving 130 are disposed so as to be opposite to each other via the movable electrode for driving 116. However, the fixed electrode for driving 130 may be disposed only one side of the movable electrode for driving 116 if the fixed electrode can vibrate the support portion for driving 112 along the X axis.

The detection portion 120 is connected to the drive portion 110. In the shown example, the detection portion 120 is disposed inside the support portion for driving 112. The detection portion 120 may include a support portion for detecting 122, a spring portion for detecting 124, and a movable electrode for detecting 126. Moreover, although not shown, if the detection portion 120 is connected to the drive portion 110, the detection portion may be disposed outside the support portion for driving 112.

For example, the support portion for detecting 122 has a frame-like shape. In the shown example, the support portion for detecting 122 is configured by third extension portions 122*a* which are extended along the X axis and fourth extension portions 122*b* which are extended along the Y axis.

The spring portion for detecting 124 is disposed outside the support portion for detecting 122. The spring portion for detecting 124 connects the support portion for detecting 122 and the support portion for driving 112. More specifically, one end of the spring portion for detecting 124 is connected to the vicinity of a corner portion (a connection portion between the third extension portion 122*a* and the fourth extension portion 122*b*) of the support portion for detecting 122. The other end of the spring portion for detecting 124 is connected to the first extension portion 112*a* of the support portion for driving 112.

The spring portion for detecting 124 has a shape which is extended along the Y axis while reciprocating along the X axis. In the shown example, four spring portions for detecting 124 are provided in the first vibrating body 106. The plurality of spring portions for detecting 124 are provided so as to be symmetrical with respect to a virtual line (not shown) along the X axis passing through the center of the support portion for detecting 122 and a virtual line (not shown) along the Y axis passing through the center of the support portion for detecting 122. Since the spring portions for detecting 124 have the above-described shape, the spring portions for detecting 124 are suppressed from being deformed in the X axis direction and the Z axis direction, and the spring portions for detecting 124 can be smoothly expanded and contracted in the Y axis direction which is a vibration direction of the detection portion 120. Moreover, according to the expansion and contraction of the spring portions for detecting 124, the support portion for detecting 122 (detection portion 120) can be displaced along the Y axis. In addition, the number of the spring portions for detecting 124 is not particularly limited if the spring portion can displace the support portion for detecting 122 along the Y axis.

The movable electrode for detecting 126 is disposed so as to be connected to the support portion for detecting 122 inside the support portion for detecting 122. In the shown example, the movable electrode for detecting 126 is extended along the X axis and is connected to two fourth extension portions 122*b* of the support portion for detecting 122.

The fixed electrode for detecting 140 is disposed inside the support portion for detecting 122. The fixed electrode for detecting 140 is fixed on the substrate 10. In the shown example, the plurality of fixed electrodes for detecting 140 are provided and disposed so as to be opposite to each other via the movable electrode for detecting 126.

The number and the shapes of the movable electrodes for detecting 126 and the fixed electrodes for detecting 140 are not particularly limited if the movable electrode and the fixed electrode can detect the change of electrostatic capacitance between the movable electrode for detecting 126 and the fixed electrode for detecting 140.

Next, an operation of the first function element 200 will be described. FIGS. 6 to 9 are views for illustrating the operation of the first function element 200 which is accommodated in the electronic device according to the present embodiment. Moreover, for convenience, in FIGS. 6 to 9, each portion of the first function element 200 is shown so as to be simplified.

Figure 6:
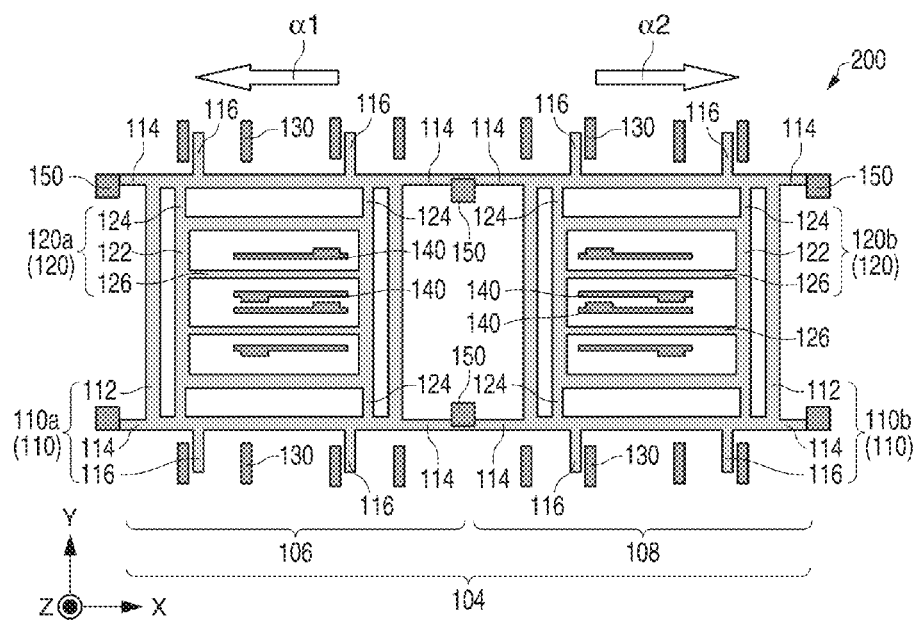
FIG. 6 is a plan view illustrating an operation of the first function element which is placed on the electronic device according to the embodiment.
Figure 7:
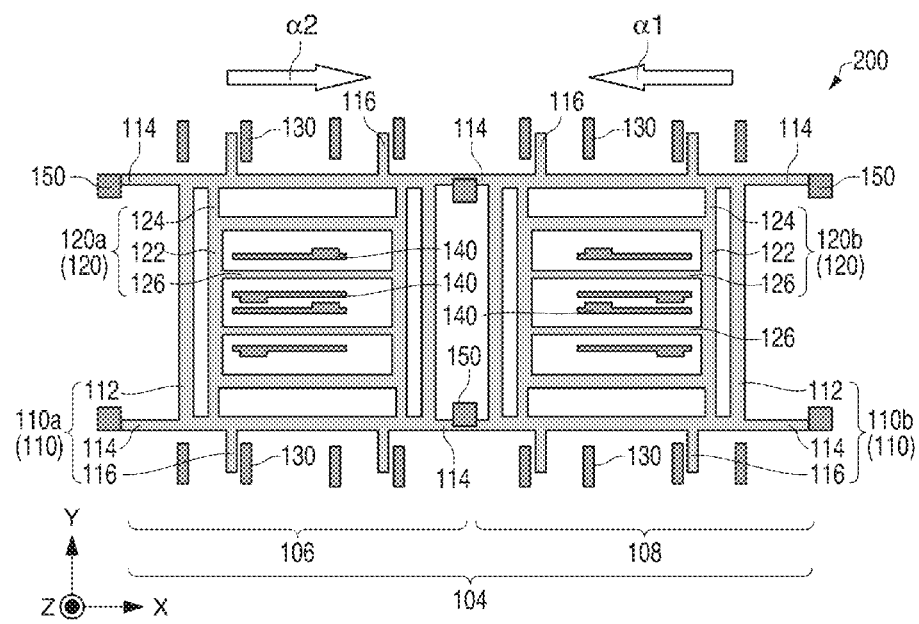
FIG. 7 is a plan view illustrating the operation of the first function element which is placed on the electronic device according to the embodiment.

If voltage is applied to the fixed electrodes for driving 130 and the movable electrodes for driving 116 by a power source (not shown), electrostatic forces are generated between the fixed electrode for driving 130 and the movable electrodes for driving 116. Thereby, as shown in FIGS. 6 and 7, the spring portions for driving 114 can be expanded and contracted along the X axis and the drive portion 110 can be vibrated along the X axis.

More specifically, a first alternating voltage is applied between the movable electrodes for driving 116 and the fixed electrodes for driving 130 of the first vibrating body 106, and a second alternating voltage, in which the phase is shifted by 180° with respect to the first alternating voltage, is applied between the movable electrodes for driving 116 and the fixed electrodes for driving 130 of the second vibrating body 108. Thereby, a first drive portion 110*a* of the first vibrating body 106 and a second drive portion 110*b* of the second vibrating body 108 can be vibrated along the X axis with reverse phases to each other and a predetermined frequency. That is, the first drive portion 110*a* and the second drive portion 110*b*, which are connected to each other along the X axis, are vibrated with reverse phases to each other along the X axis. In the example shown in FIG. 6, the first drive portion 110*a* is displaced in a α1 direction and the second drive portion 110*b* is displaced in a α2 direction which is a direction opposite to the α1 direction. In the example shown in FIG. 7, the first drive portion 110*a* is displaced in the α2 direction and the second drive portion 110*b* is displaced in the Ca direction.

Moreover, since the detection portion 120 is connected to the drive portion 110, the detection portion 120 is also vibrated along the X axis according to the vibration of the drive portion 110. That is, the first vibrating body 106 and the second vibrating body 108 are displaced in directions opposite to each other along the X axis.

Figure 8:
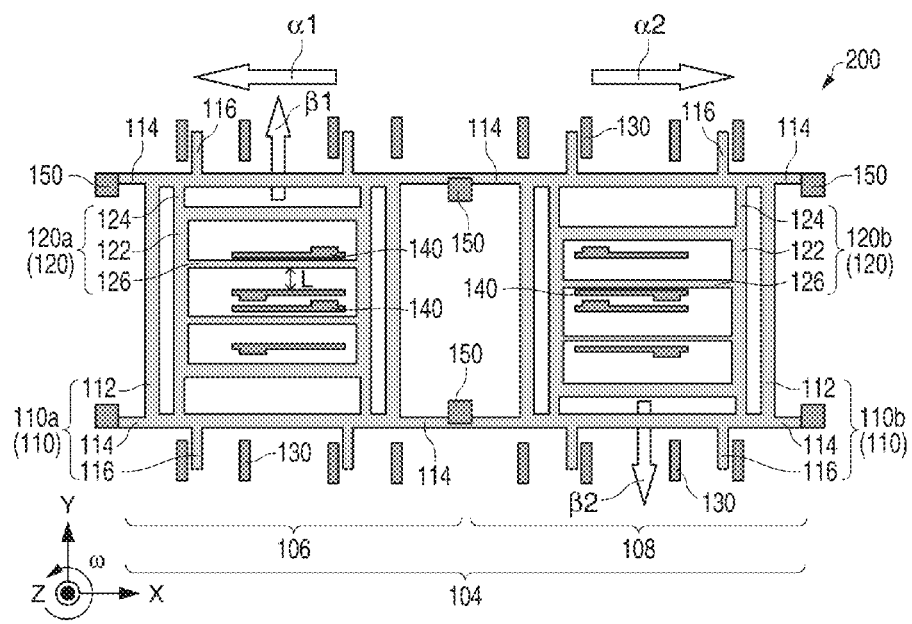
FIG. 8 is a plan view illustrating the operation of the first function element which is placed on the electronic device according to the embodiment.
Figure 9:
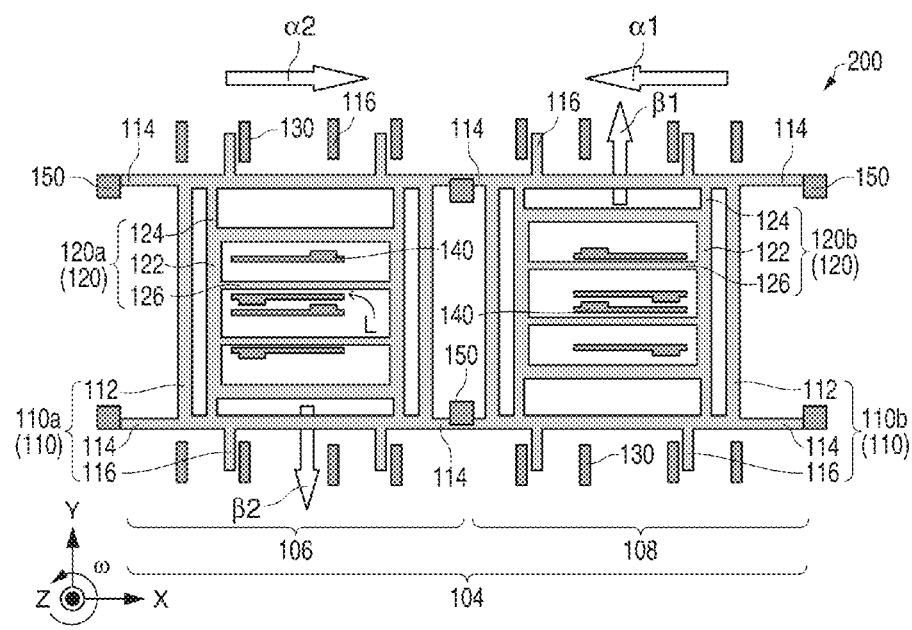
FIG. 9 is a plan view illustrating the operation of the first function element which is placed on the electronic device according to the embodiment.
Figure 10:
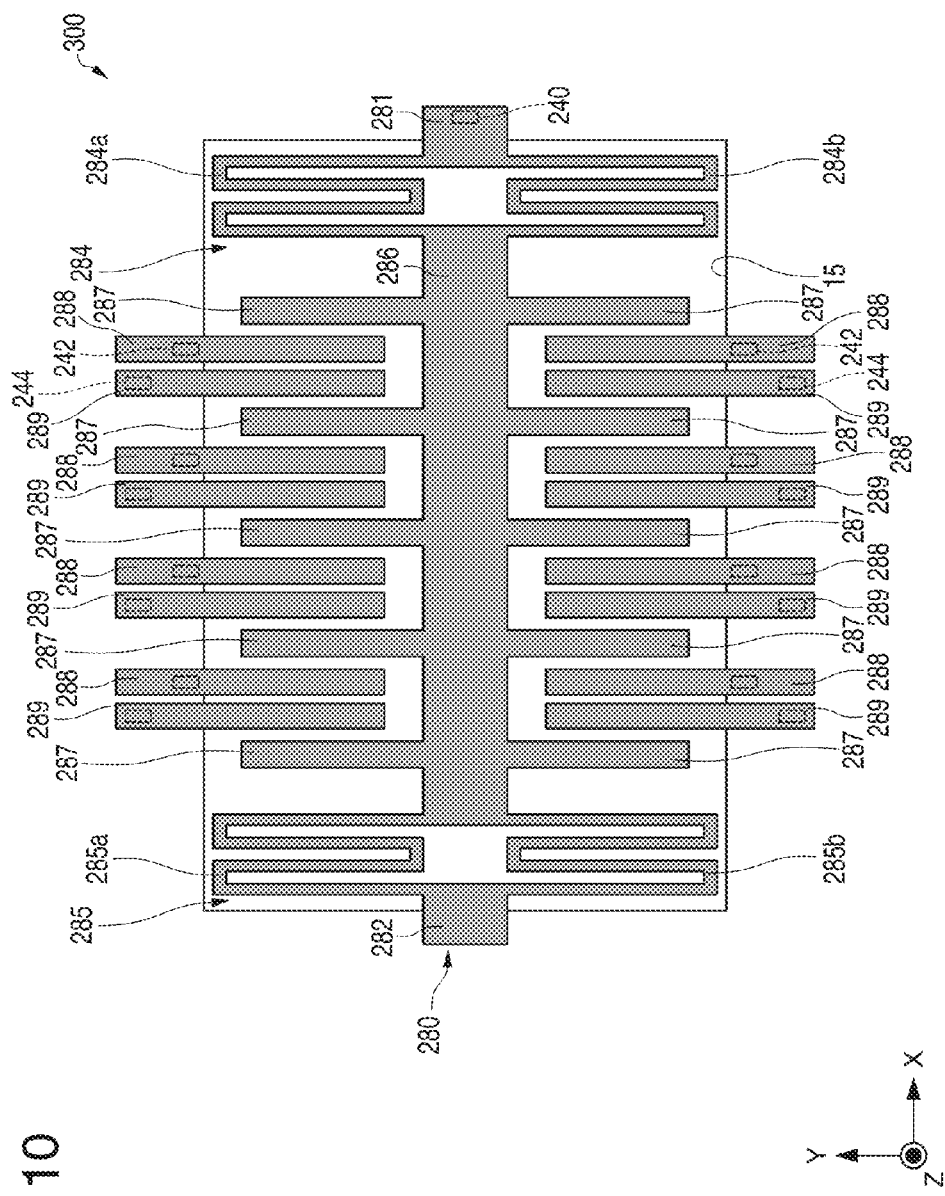
FIG. 10 is a plan view schematically showing an example of a second function element which is placed on the electronic device according to the present embodiment.

As shown in FIGS. 8 and 9, if angular velocity w around the Z axis is applied to the function element 200 in a state where the drive portions 110*a* and 110*b* perform a first vibration, Coriolis force is operated, and thus, the detection portion 120 is displaced along the Y axis. That is, a first detection portion 120*a* which is connected to the first drive portion 110*a* and a second detection portion 120*b* which is connected to the second drive portion 110*b* are displaced in directions opposite to each other along the Y axis by the first vibration and Coriolis force. In the example shown in FIG. 8, the first detection portion 120*a* is displaced in a β1 direction and the second detection portion 120*b* is displaced in a β2 direction which is a direction opposite to the β1 direction. In the example shown in FIG. 9, the first detection portion 120*a* is displaced in the β2 direction and the second detection portion 120*b* is displaced in the β1 direction.

Since the detection portions 120*a* and 120*b* are displaced along the Y axis, the distance L between the movable electrode for detecting 126 and the fixed electrode for detecting 140 is changed. Thereby, the electrostatic capacitance between the movable electrode for detecting 126 and the fixed electrode for detecting 140 is changed. In the first function element 200, by applying voltage to the movable electrodes for detecting 126 and the fixed electrodes for detecting 140, an amount of change of the electrostatic capacitances between the movable electrodes for detecting 126 and the fixed electrodes for detecting 140 is detected, and the angular velocity ω around the Z axis can be obtained.

Moreover, in the above description, the aspect (electrostatic drive type) in which the drive portion 110 is driven by the electrostatic force is described. However, the method for driving the drive portion 110 is not particularly limited, and a piezoelectric drive type, an electromagnetic drive type which uses Lorentz force of a magnetic field, or the like may be applied. In addition, the configuration of the gyro sensor, since the atmosphere is set to decompression, improved vibration characteristics and detection characteristics can be obtained.

Configuration of Acceleration Sensor

The second function element 300 is supported on the first surface 11 of the substrate 10 (on the substrate 10). As shown in FIG. 10, the second function element 300 includes fixing portions 281 and 282, connection portions 284 and 285, a movable portion 286, movable electrode portions 287, and fixed electrode portions 288 and 289.

The movable portion 286 is displaced in the X axis direction (+X direction or −X direction) while elastically deforming the connection portions 284 and 285 according to the change of acceleration in the X axis direction. According to this change, the intervals between the movable electrode portions 287 and the fixed electrode portions 288, and the sizes of the intervals between the movable electrode portions 287 and the fixed electrode portions 289 are changed. That is, according to this change, electrostatic capacitances between the movable electrode portions 287 and the fixed electrode portions 288, and magnitudes of the electrostatic capacitances between the movable electrode portions 287 and the fixed electrode portions 289 are changed. The second function element 300 can detect the acceleration in the X axis direction based on the change of the electrostatic capacitances.

The fixed portions 281 and 282 are bonded to the first surface 11 of the substrate 10. In the shown example, the fixing portions 281 and 282 are provided so as to straddle the outer circumferential edge of the second concave portion 15 in a plan view.

The movable portion 286 is provided between the fixing portion 281 and the fixing portion 282. In the example shown in FIG. 10, the planar shape of the movable portion 286 is a rectangular shape which has a long side along the X axis.

The connection portions 284 and 285 connect the movable portion 286 to the fixing portions 281 and 282. The connection portions 284 and 285 have a desired spring constant and are configured so as to displace the movable portion 286 in the X axis direction. In the example shown in FIG. 10, the connection portion 284 is configured by two beams 284a and 284b which meander in the Y axis direction and are formed so as to be extended in the X axis direction. Similarly, the connection portion 285 is configured by two beams 285a and 285b which meander in the Y axis direction and are formed so as to be extended in the X axis direction.

The movable electrode portions 287 are connected to the movable portion 286. The plurality of movable electrode portions 287 are provided. The movable electrode portions 287 protrude in +Y direction and −Y direction from the movable portion 286 and are arranged in the X axis direction so as to form a shape of comb teeth.

In each of the fixed electrode portions 288 and 289, one end is bonded to the first surface 11 of the substrate 10 as a fixed end, and the other end is extended to the movable portion 286 side as a free end. The plurality of fixed electrode portions 288 and 289 are provided respectively. The fixed electrode portions 288 are electrically connected to wirings (not shown), and the fixed electrode portions 289 are electrically connected to wirings (not shown). The fixed electrode portions 288 and 289 are alternately arranged in the X axis direction so as to form a shape of comb teeth. The fixed electrode portions 288 and 289 are provided so as to be opposite to the movable electrode portions 287 with intervals, the fixed electrode portions 288 are disposed in one side (−X direction side) of the movable electrode portions 287, and the fixed electrode portions 289 are disposed in the other end (+X direction side).

The fixing portions 281 and 282, the connection portions 284 and 285, the movable portion 286, and the movable electrode portions 287 are integrally formed.

The fixing portion 281 includes a contact portion 240 which is connected to wirings (not shown). Thereby, the fixing portion 281 is electrically connected to an external connection terminal. Moreover, the fixed electrode portions 288 include contact portions 242 which are connected to wirings (not shown). Thereby, the fixed electrode portions 288 are electrically connected to the external connection terminal. In addition, the fixed electrode portions 289 include contact portions 244 which are connected to wirings (not shown). Thereby, the fixed electrode portions 289 are electrically connected to the external connection terminal.

In the second function element 300, the electrostatic capacitances between the movable electrode portions 287 and the fixed electrode portions 288 can be measured using the external connection thermal which is electrically connected. Moreover, in the second function element 300, the electrostatic capacitances between the movable electrode portions 287 and the fixed electrode portions 289 can be measured using the external connection terminal which is electrically connected. In this way, in the second function element 300, the electrostatic capacitances between the movable electrode portions 287 and the fixed electrode portions 288, and the electrostatic capacitances between the movable electrode portions 287 and the fixed electrode portions 289 are separately measured, and based on the measured results, physical quantity (acceleration) can be detected with high accuracy. Moreover, in the configuration of the acceleration sensor, the atmosphere is set to atmospheric pressure, air viscosity is used, and thus, improved detection characteristics can be obtained.

For example, the electronic devices 100, 101, 102, and 103 according to the present embodiments have the following characteristics.

According to the electronic devices 100, 101, and 102, the first cavity 31 and the second cavity 32 are isolated from each other by the partition wall portion 25 which is integrally provided in the cover body 20 or the substrate 10.

As described above, since the electronic devices 100, 101, 102, and 103 are electronic devices in which the plurality of physical quantity detection sensors (first function element 200 and second function element 300) are mounted in the same package 30 (the same substrate), it is possible to meet the demands for size reduction and the space saving. Moreover, since the process, which electrically connects the substrates on which the sensors are mounted by lamination or the like, can be omitted, it can contribute to simplification of the production processes or reduction of the production costs.

Here, in an electronic device in which cavities having inner pressures different from each other are formed in the same package, when airtightness of the cavities is decreased, defects occur in the function elements accommodated in the cavities, and there is a concern that reliability of the electronic device itself may be decreased. Therefore, it is necessary to securely isolate each cavity and secure high airtightness of the cavities.

According to the electronic devices 100, 101, 102, and 103, the first cavity 31 and the second cavity 32 are isolated from each other by the partition wall portion 25 which is integrally provided in the cover body 20 or the substrate 10. According to this, the first cavity 31 and the second cavity 32 are configured by only two members of the substrate 10 and the cover body 20 without a seal member. In other words, the bond interface between members, which is required for configuring two cavities in the same package, includes only the bond surface between the substrate 10 and the cover body 20. Therefore, compared to an electronic device in which a partition wall portion other than the substrate and the cover body isolates between the cavities having inner pressures different from each other, an electronic device having improved reliability can be provided.

From the above, an electronic device which meets the demands for size reduction, the space saving, and reduction of the production costs can be provided, and an electronic device having improved reliability can be provided.

In addition, according to the electronic devices 101 and 102, only any one of the first through-hole 41 and the second through-hole 42 is formed. As a result, the through-hole which communicates with any one of the first cavity 31 or the second cavity 32 is not provided, and the inner surface of the cavity is configured by only the substrate 10 and the cover body 20.

Generally, in the sealing process which uses the through-holes, for example, the seal members which are formed of alloy such as AuGe are disposed in the through-holes, the seal members are heated to high temperature of approximately 300° C. by laser or the like, the seal members are melted at a time, the through-holes are blocked, and the cavities are sealed in a desired atmosphere.

When each through-hole is provided in each cavity in the same package, laser irradiation is performed respectively, the seal member is heated and melted to approximately 300° C., for example, and thus, the through-hole is sealed. In the sealing process, in order to prevent remelting of the heated seal member, it is necessary to control the heating temperature of the seal member in the through-hole after the second location to temperature lower than the heating temperature at the first location.

According to the electronic devices 101 and 102, since only one through-hole for sealing is formed in the electronic devices which include two cavities in the same package, the material costs of the seal member which is formed of alloy such as AuGe are reduced, and the sealing process of the through-hole, which requires a temperature control having high accuracy, can be decreased. Therefore, an electronic device, which can contribute to reduction of the production costs and simplification of the production processes, can be provided.

In addition, according to the electronic devices 101 and 102, since the plurality of through-holes are not provided, it is not necessary to heat the package plural times in order to seal the through-hole. According to this, it is possible to prevent the seal member from being remelted due to the plurality of times of sealing processes and airtightness from being decreased. Accordingly, compared to the electronic device in which the plurality of through-holes are provided in the same package due to the reason of the manufacturing process, an electronic device having higher airtight reliability can be provided.

Moreover, according to the electronic devices 103, the through-hole 40 includes the bottom surface 41 and communicates with the cavity through the communication hole 46 provided on the bottom surface 41. Thereby, when the seal member disposed in the through-hole 40 is melted and the cavity is sealed, a portion of the seal member can be suppressed from being scattering into the cavity and attached to the function element. As a result, an electronic device having higher reliability can be provided.

2. Manufacturing Method of Electronic Device

Next, a manufacturing method of the electronic device according to the embodiment of the invention will be described. A manufacturing method of the electronic device according to the embodiment of the invention includes: a process in which the first function element 200 and the second function element 300 are placed on the substrate 10; an accommodation process in which the cover body 20 is placed on the substrate 10, the first function element 200 is accommodated in the first cavity 31 which is surrounded by the substrate 10 and the cover body 20, and the second function element 300 is accommodated in the second cavity 32 which is surrounded by the substrate 10 and the cover body 20; and a sealing process in which the first cavity 31 is sealed at a first air pressure atmosphere, and the second cavity 32 is sealed at a second air pressure atmosphere having differences of air pressure with respect to the first air pressure atmosphere, and the first cavity and the second cavity are isolated from each other by the partition wall portion which is integrally provided in the cover body or the substrate.

According to the manufacturing method of the electronic device according to the embodiment of the invention, the first cavity 31 and the second cavity 32 are isolated from each other by the partition wall portion 25 which is integrally provided in the cover body 20 or the substrate 10. According to this, it is not necessary to separately prepare a member for isolating the cavities so as to bond the cover body and the substrate. Therefore, the manufacturing process is more simplified, and the manufacturing method which can manufacture the electronic device having more improved reliability can be provided.

Hereinafter, the manufacturing method of the electronic device 100 according to the first embodiment and the manufacturing methods of the electronic devices 101 and 102 according to the second embodiment will be described with reference to the drawings.

Manufacturing Method of Electronic Device According to First Embodiment

Figure 11:
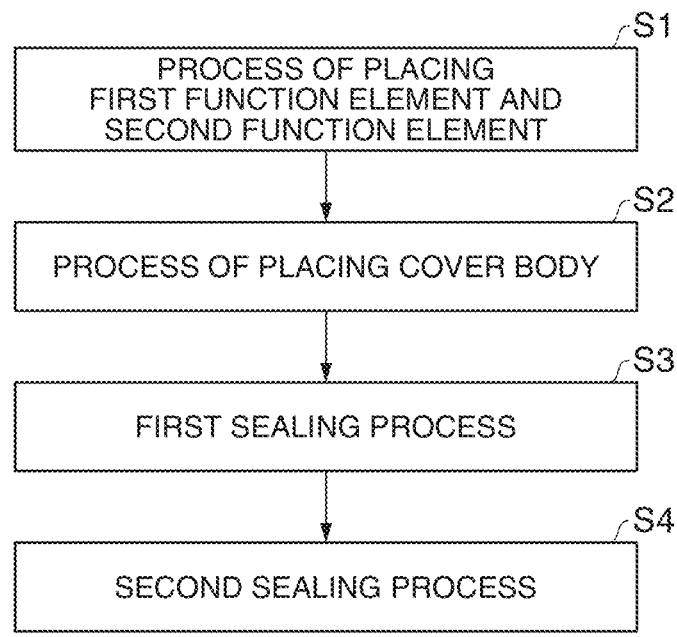
FIG. 11 is a flowchart showing a manufacturing method of the electronic device according to the first embodiment.

FIG. 11 is a flowchart of the manufacturing process of the electronic device 100 according to the first embodiment.

Figure 12:
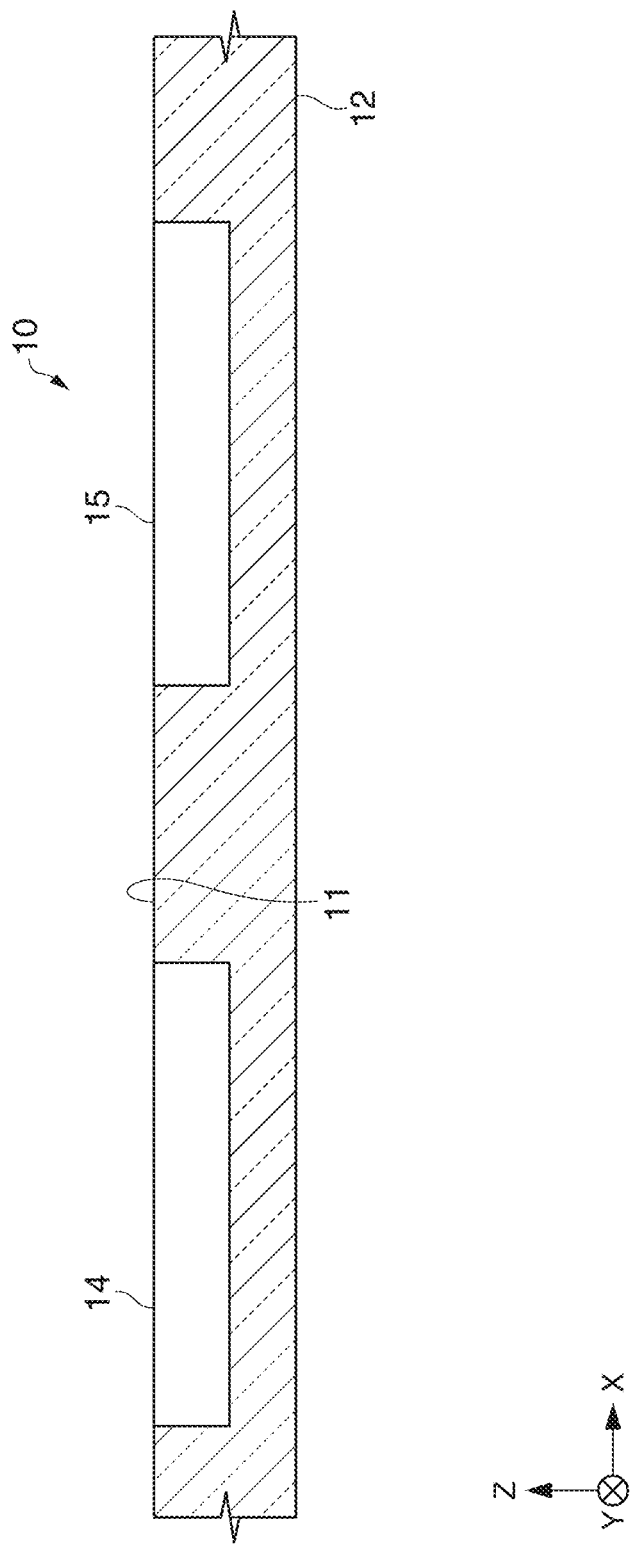
FIG. 12 is a cross-sectional view schematically showing the manufacturing method of the electronic device according to the first embodiment.
Figure 13:
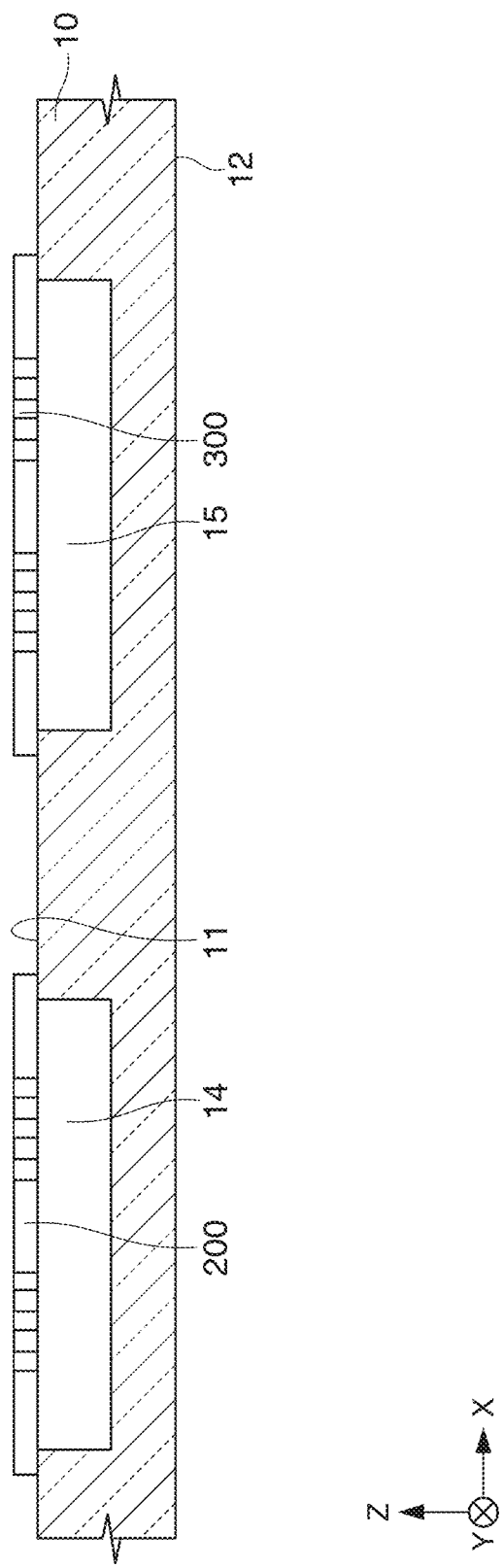
FIG. 13 is a cross-sectional view schematically showing the manufacturing method of the electronic device according to the first embodiment.
Figure 14:
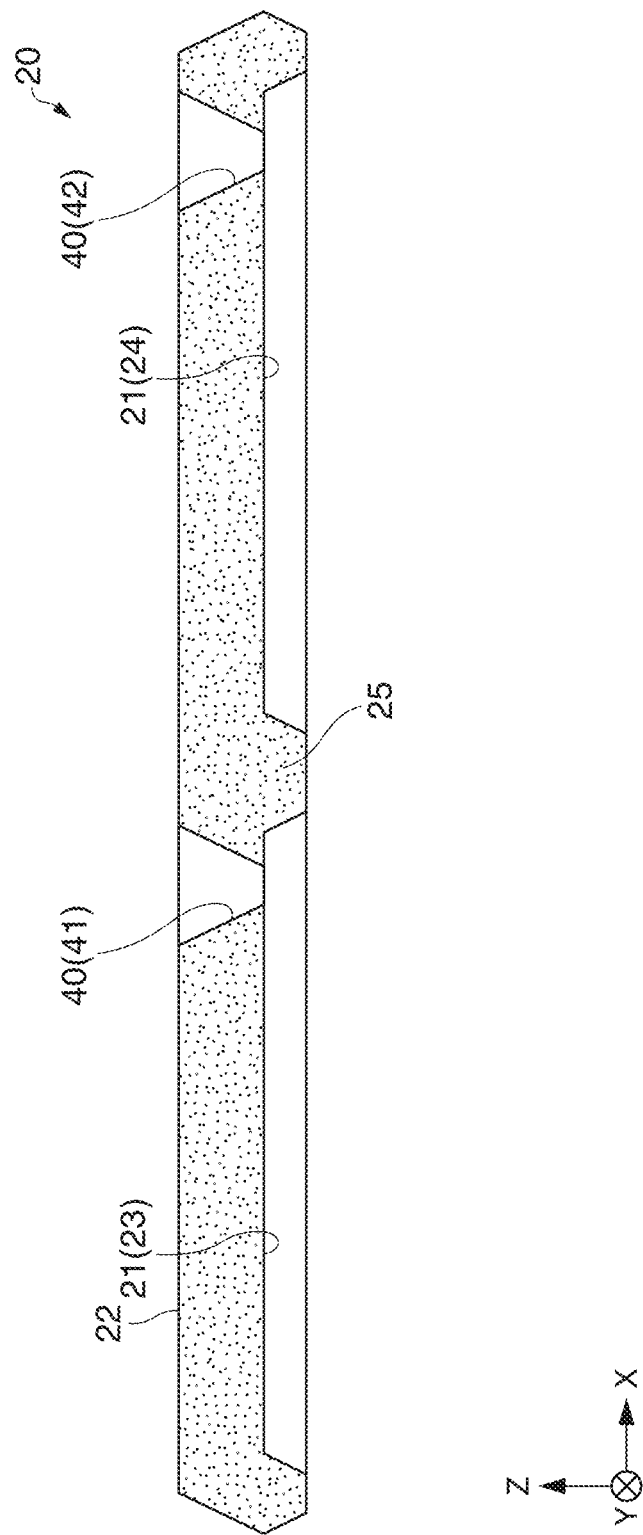
FIG. 14 is a cross-sectional view schematically showing the manufacturing method of the electronic device according to the first embodiment.

FIGS. 12 to 14 are cross-sectional views schematically showing the manufacturing process of the electronic device 100 according to the first embodiment and are corresponding to FIG. 1.

As shown in FIG. 11, the manufacturing process of the electronic device 100 according to the first embodiment includes: a process (S1) of placing the first function element 200 and the second function element 300 on the substrate 10; a process (S2) of placing the cover body 20 on the substrate 10, accommodating the first function element 200 in the first cavity 31 which is surrounded by the substrate 10 and the cover body 20, and accommodating the second function element 300 in the second cavity 32 which is surrounded by the substrate 10 and the cover body 20; a first sealing process (S3) of sealing the first cavity 31 in the first air pressure atmosphere; and a second sealing process (S4) of sealing the second cavity 32 in a second air pressure atmosphere after the first sealing process.

First, the substrate 10 is prepared. As shown in FIG. 12, the first concave portion 14 and the second concave portion 15 are formed on the first surface 11 of the substrate 10. At this time, a groove (not shown) may be formed around the first concave portion 14 and the second concave portion 15. For example, the first concave portion 14 and the second concave potion 15 are formed by a photolithography technology and an etching technology. Thereby, the substrate 10 in which the first concave portion 14 and the second concave portion 15 are provided on the first surface 11 can be prepared.

Here, although not shown, wirings, which electrically connect to the first and second function elements 200 and 300, may be formed on the substrate 10 which includes the inner portions of the first concave portion 14 and the second concave portion 15. For example, after a film is formed by a sputtering method, Chemical Vapor Deposition (CVD) method, or the like, the film is patterned by the photolithography technology and the etching technology, and thus, the wirings are formed.

Subsequently, as shown in FIG. 13, the first function element 200 and the second function element 300 are placed on the substrate 10 (S1). Specifically, a silicon substrate (not shown) is placed (bonded) on the first substrate 11 of the substrate 10, and after the silicon substrate is thinned, the silicon substrate is patterned, and thus, the first function element 200 and the second function element 300 are formed. The patterning is performed by the photolithography technology and the etching technology. For example, the bonded between the silicon substrate and the substrate 10 is performed by anodic bonding.

Subsequently, as shown in FIG. 14, the cover body 20 is prepared. The cover body 20 is formed by preparing a silicon substrate, and by forming the first concave portion 14 and the second concave portion 15 on the first surface 22 by the photolithography technology and the etching technology. Moreover, the first through-hole 41 and the second through-hole 42 which communicate with the first concave portion 14 and the second concave portion 15 are also formed by the similar process. Here, the first through-hole 41 and the second through-hole 42 are formed by anisotropic wet etching, and thus, the inner wall surfaces of the first through-hole 41 and the second through-hole 42 can be formed in taper shapes.

Moreover, although not shown, the conductive layer 43, which covers the inner wall surfaces of the first through-hole 41 and the second through-hole 42, may be formed. For example, after a film is formed by a sputtering method, Chemical Vapor Deposition (CVD) method, or the like, the film is patterned by the photolithography technology and the etching technology, and thus, the conductive layer 43 is formed.

Figure 15:
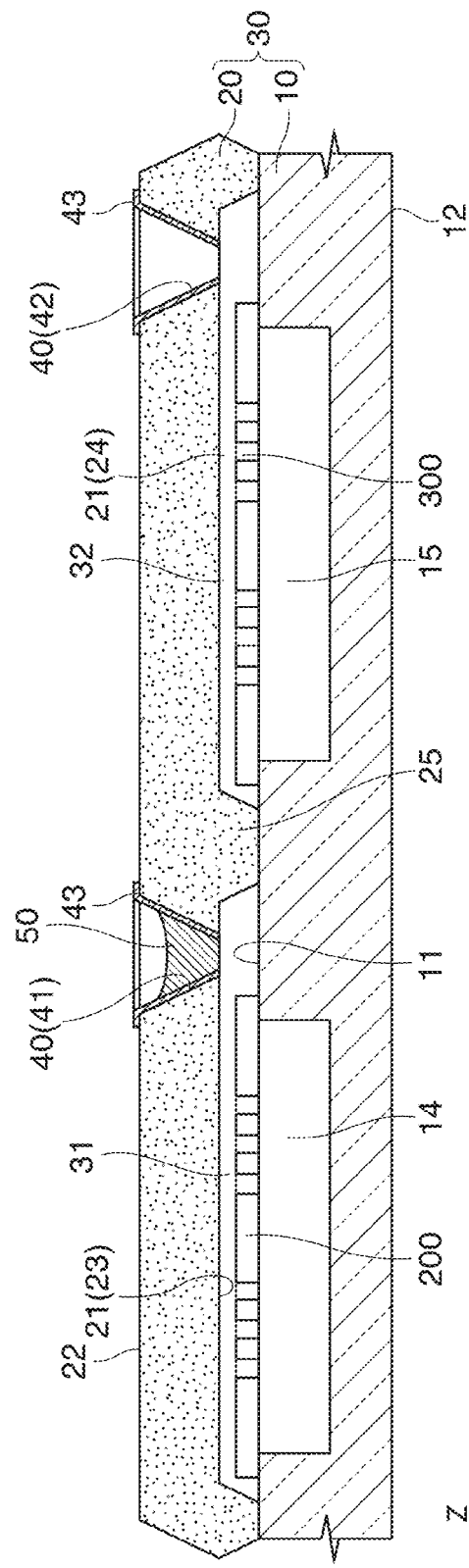
FIG. 15 is a cross-sectional view schematically showing the manufacturing method of the electronic device according to the first embodiment.

Subsequently, as shown in FIG. 15, the substrate 10 and the cover body 20 are bonded, and the first function element 200 and the second function element 300 are accommodated respectively in the first cavity 31 and the second cavity 32 which are surrounded by the substrate 10 and the cover body 20 (S2). For example, the bonding between the substrate 10 and the cover body 20 is performed by anodic bonding.

Subsequently, the first cavity 31 is sealed in the first air pressure atmosphere (first sealing process: S3). For example, in this process, as shown in FIG. 15, the seal member 50 is formed in the first through-hole 41 in a decompression atmosphere. More specifically, a spherical solder ball (not shown) is disposed in the first through-hole 41, the solder ball is melted by laser irradiation, and thus, the seal member 50 is formed. According to this process, the first cavity 31 can be sealed by the seal member 50.

Subsequently, the second cavity 32 is sealed in the second air pressure atmosphere (second sealing process: S4). For example, in this process, the seal member 50 is formed in the second through-hole 42 in an inert gas atmosphere such as nitrogen gas (refer to FIG. 1). More specifically, a spherical solder ball (not shown) is disposed in the second through-hole 42, the solder ball is melted by laser irradiation, and thus, the seal member 50 is formed. According to this process, the second cavity 32 can be sealed by the seal member 50 (refer to FIG. 1).

According to the above-described processes, the electronic device 100 can be manufactured.

For example, according to the manufacturing method of the electronic device 100, the following characteristics are provided.

According to the manufacturing method of the electronic device 100, an electronic device having improved reliability can be provided. According to the manufacturing method of the electronic device 100, the first cavity 31 and the second cavity 32 are isolated from each other by the partition wall portion 25 which is integrally provided in the cover body 20. According to this, since it is not necessary to separately prepare a member for isolating the cavities, an electronic device having more improved reliability can be manufactured by more simple method.

In addition, according to the manufacturing method of the electronic device 100, the second sealing process (S4) under the second air pressure atmosphere is performed after the first sealing process (S3) under the first air pressure atmosphere. At this time, the second air pressure atmosphere performs the sealing process under air pressure higher than the first air pressure atmosphere. Here, if the sealing process is performed in a state where the second air pressure atmosphere is lower than the first air pressure atmosphere, pressure in a direction from the inside of the first cavity 31 toward the outside is applied to the substrate 10, the cover body 20, the partition wall portion 25, the seal member 50, or the like which seals the first cavity 31. That is, the pressure is operated in the direction in which the first cavity 31 is expanded. This becomes a cause which generates a leak pass in the bond surface between the substrate 10 and the cover body 20, the bond surface between the substrate 10 and the partition wall portion 25, the bond surface between the cover body 20 and the seal member 50, and the like. Therefore, airtightness of the first cavity 31 may be decreased. On the other hand, according to the manufacturing method of the electronic device 100, in the second sealing process (S4), pressure in the direction from the outside of the first cavity 31 toward the inside can be applied to the seal member 50 which seals the first cavity 31 in the first sealing process (S3). Thereby, a decrease in the bonding reliability of the substrate 10, the cover body 20, and the seal member 50 which surround the first cavity 31 is not generated. Moreover, the bonding reliability of the seal member 50 which seals the second cavity 32 can be further increased. Thereby, an electronic device having more improved reliability can be provided.

For example, the first function element 200 which is a gyro sensor is disposed in the first cavity 31, and is sealed in a decompression atmosphere which is the first air pressure atmosphere, for example, in 10 Pa or less. Subsequently, the second function element 300 which is an acceleration sensor is disposed in the second cavity 32, and is sealed in an atmospheric pressure atmosphere which is the second air pressure atmosphere, for example, approximately 1013 hPa. At this time, since the first cavity 31 is returned from the decompression atmosphere to the atmospheric pressure state, the pressure from the outside is applied to the substrate or the cover body, and thus, reliability of the bond surface can be increased.

Moreover, according to the manufacturing method of the electronic device 100, the material of the substrate 10 may be glass, and the material of the cover body 20 may be silicon. According to this, the cover body 20 is formed of the material having better workability than the substrate 10. Therefore, compared to a case where the concave portion which accommodates the function element is provided in the substrate 10 side, the electronic device can be manufactured by the more simple method.

Manufacturing Method of Electronic Device According to Second Embodiment

Figure 16:
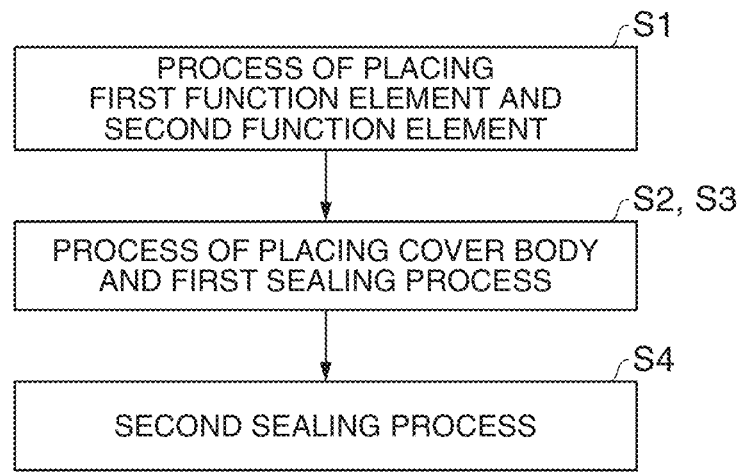
FIG. 16 is a flowchart showing a manufacturing method of the electronic device according to the second embodiment.

Next, the manufacturing method of the electronic device according to the second embodiment will be described with reference to the drawings. FIG. 16 is a flowchart of the manufacturing processes of the electronic devices 101 and 102 according to the second embodiment. As shown in FIG. 16, the manufacturing method of the electronic device according to the second embodiment is different from the manufacturing method of the electronic device according to the first embodiment in that the first sealing process (S3) is performed concurrently with the process (S2) of placing the cover body 20. In the descriptions below, only the matters in which the manufacturing method of the electronic device according to the second embodiment is different from the manufacturing method of the device according to the first embodiment will be described. The detailed descriptions with respect to the processes previously described are omitted.

First, similar to the first embodiment, the substrate 10 is prepared, and the first function element 200 and the second function element 300 are placed on the substrate 10 (refer to S1 and FIGS. 12 and 13). Subsequently, the cover body 20 is prepared. In the manufacturing method according to the second embodiment, the cover body 20 which is shown in FIG. 2 or 3 is prepared. Here, the cover body 20, in which the through-hole which communicates with any one of the first cavity 31 or the second cavity 32 is not provided, is prepared.

Subsequently, as shown in FIG. 16, the process (S2) of placing the cover body 20 and the first sealing process (S3) are simultaneously performed. In the manufacturing method of the electronic device according to the second embodiment, the cover body 20 is placed on the substrate 10 (S2) under the appropriate air pressure atmosphere of the function element which is accommodated in the cavity with which the through-hole does not communicate, and thereby, the cavity with which the through-hole does not communicate is sealed (first sealing process: S3). Accordingly, in the manufacturing method according to the embodiment, the cover body 20 is placed on the substrate 10 under the air pressure atmosphere in the cavity with which the through-hole 40 does not communicate. For example, when the electronic device 101 in which the second through-hole 42 which communicates with the second cavity is not provided is manufactured as shown in FIG. 2, the bonding between the cover body 20 and the substrate 10 is performed in the second air pressure atmosphere of the second cavity 32. Thereby, the second cavity 32 can be sealed in the second air pressure atmosphere. Moreover, when the electronic device 102 in which the first through-hole 41 which communicates with the first cavity is not provided is manufactured as shown in FIG. 3, the bonding between the cover body 20 and the substrate 10 is performed in the first air pressure atmosphere of the first cavity 31. Thereby, the first cavity 31 can be sealed in the first air pressure atmosphere.

The sealing atmosphere of the first sealing process (S3) which is performed concurrently with the placing process (S2) is appropriately selected according to the type of the function element which is accommodated in the cavity with which the through-hole 40 does not communicate. When a gyro sensor described above is adopted as the first function element 200 accommodated in the first cavity 31 and an acceleration sensor (electrostatic capacitance type MEMS acceleration sensor element) described above is adopted as the second function element 300 accommodated in the second cavity 32, the first air pressure atmosphere which is a desired sealing atmosphere in the first cavity 31 becomes a decompression atmosphere (more preferably, vacuum atmosphere), and the second air pressure atmosphere which is a desired sealing atmosphere in the second cavity 32 becomes an atmospheric pressure atmosphere.

When the electronic device 101 is manufactured, in the bonding between the cover body 20 and the substrate 10, since the bonding is performed in the atmosphere, low-melting glass (not shown) which is stronger than the bonding by means of the anodic bonding is appropriately adopted. For example, when a lead glass material is used as the material of the low-melting glass, since the bonding in the atmosphere can be performed at low temperature (for example, approximately 320° C. to 360° C.), oxidative damage with respect to peripheral members such as wirings can be reduced during the bonding process.

After the first sealing process (S3), for example, the atmosphere of the manufacturing process is set to a decompression state (preferably, a vacuum state) of 10 Pa or less, and the first cavity 31 with which the first through-hole 41 communicates is sealed using the seal member 50 (second sealing process: S4). Heating and melting of the seal member 50 are performed by laser irradiation. In this case, the first cavity 31 is sealed under the decompression atmosphere in the state where the second cavity 32 is maintained to the atmospheric pressure. However, since the bonding by means of the low-melting glass is stronger than the bonding by means of the anodic bonding, the problem that the bonding strength is decreased does not occur.

In the case of the electric device 102, in the bonding between the cover body 20 and the substrate 10, the anodic bonding (not shown) in which the strong bonding is possible even under the decompression atmosphere (for example, 10 Pa or less) is appropriately adopted. When the bonding by means of low-melting glass such as a lead glass material is performed under the decompression atmosphere, since oxygen which is needed in the adhesive response is not sufficiently supplied, there is a concern that time may be necessary for the adhesive response, or the bonding strength may be decreased due to the insufficient adhesive response. However, since the anodic bonding using a covalent bond can perform the bonding without receiving the influence of the decompression atmosphere, the bonding reliability of the anodic bonding is higher than the low-melting glass under the decompression atmosphere. Moreover, even when the material of the first function element and the second function element use a material in which oxidation should be avoided, since the bonding processing is performed under the decompression atmosphere, oxidative damages do not easily occur during the process.

After the first sealing process (S3), the atmosphere of the manufacturing process is set to an atmospheric pressure state, and the second cavity 32 with which the second through-hole 42 communicates is sealed using the seal member 50 (second sealing process: S4). The heating and melting of the seal member 50 are performed by laser irradiation. In this case, since stress is generated from the outside toward the inside in the first cavity 31 which is sealed in the decompression atmosphere, the bonding strength between the substrate 10 and the cover body 20 can be increased.

Moreover, in the manufacturing method of the electronic device 102 shown in FIG. 3, the bonding between the substrate 10 and the cover body 20 may use leadless low-melting glass in addition to the anodic bonding.

According to the above-described processes, the electronic devices 101 and 102 can be manufactured.

For example, according to the manufacturing methods of the electronic devices 101 and 102, the following characteristics are provided.

According to the manufacturing methods of the electronic devices 101 and 102, the first sealing process of the cavity with which the through-hole does not communicate can be performed in the accommodating process. According to this, the material costs of the seal member which is formed of alloy such as AuGe are reduced, and the sealing process of the through-hole, which requires a temperature control having high accuracy, can be simplified. Therefore, the manufacturing method of the electronic device, which can contribute to reduction of the production costs and simplification of the production processes, can be provided.

In addition, according to the manufacturing methods of the electronic devices 101 and 102, in the sealing process which seals two cavities, the process which seals the through-hole by the seal member is once (second sealing process), and it is not necessary to heat the package in plural times. According to this, it is possible to prevent the seal member from being remelted due to the plurality of times of sealing processes and airtightness from being decreased. Accordingly, compared to the manufacturing method of the electronic device in which the plurality of times of sealing processes are performed in the same package, the manufacturing method of the electronic device, in which the electronic device having higher airtight reliability is manufactured, can be provided.

Moreover, according to the manufacturing method of the electronic device 102 (FIG. 3), after the second cavity 32 is sealed under the second air pressure atmosphere, the first cavity 31 is sealed under the first air pressure atmosphere which is air pressure higher than the second air pressure atmosphere. According to this, the pressure of the direction toward the inside of second cavity can be applied to the package of the electronic device under the first air pressure atmosphere. Thereby, adhesiveness between the cover body and the substrate is improved, and an electronic device having more improved reliability can be provided.

3. Electronic Apparatus

Next, an electronic apparatus according to the embodiment will be described with reference to the drawings. The electronic apparatus according to the embodiment includes the electronic device 100 (or any one of 101, 102, and 103) according to the embodiment of the present invention.

Figure 17:
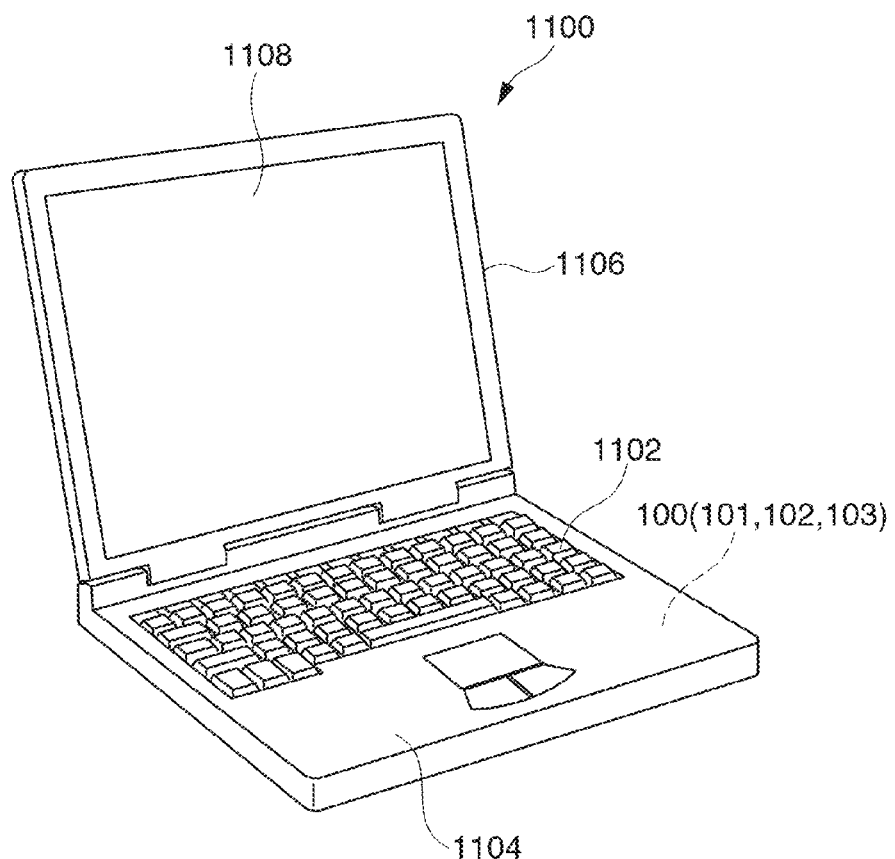
FIG. 17 is a perspective view schematically showing an electronic apparatus.

FIG. 17 is a perspective view schematically showing a mobile type (or note-type) personal computer 1100 as the electronic apparatus according to the embodiment.

As shown in FIG. 17, the personal computer 1100 is configured by a main body portion 1104 which includes a keyboard 1102 and a display unit 1106 which includes a display portion 1108, and the display unit 1106 is supported so as to rotate via a hinge structure with respect to the main body portion 1104.

The electronic device 100 is built in the above-described personal computer 1100.

Figure 18:
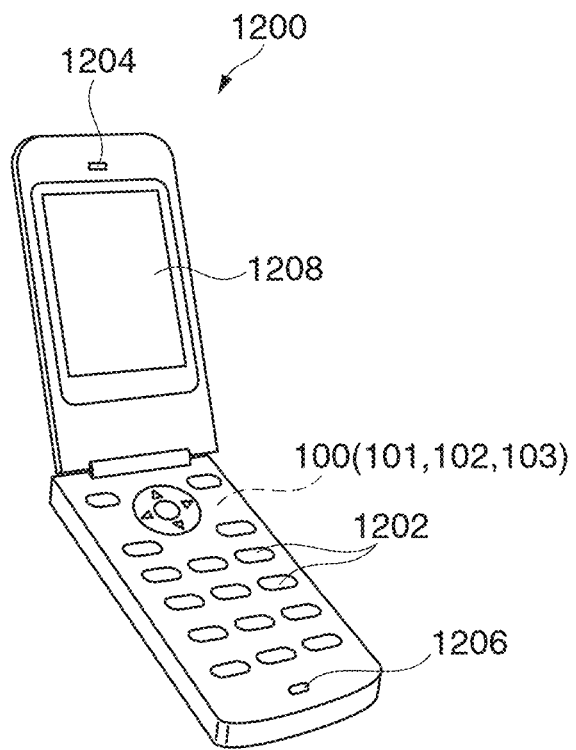
FIG. 18 is a perspective view schematically showing an electronic apparatus.

FIG. 18 is a perspective view schematically showing a portable phone 1200 (which also includes PHS) as the electronic apparatus according to the embodiment.

As shown in FIG. 18, the portable phone 1200 includes a plurality of operation buttons 1202, an ear piece 1204, and a mouth piece 1206, and a display portion 1208 is disposed between the operation buttons 1202 and the ear piece 1204.

The electronic device 100 (or any one of 101, 102, and 103) is built in the above-described portable phone 1200.

Figure 19:
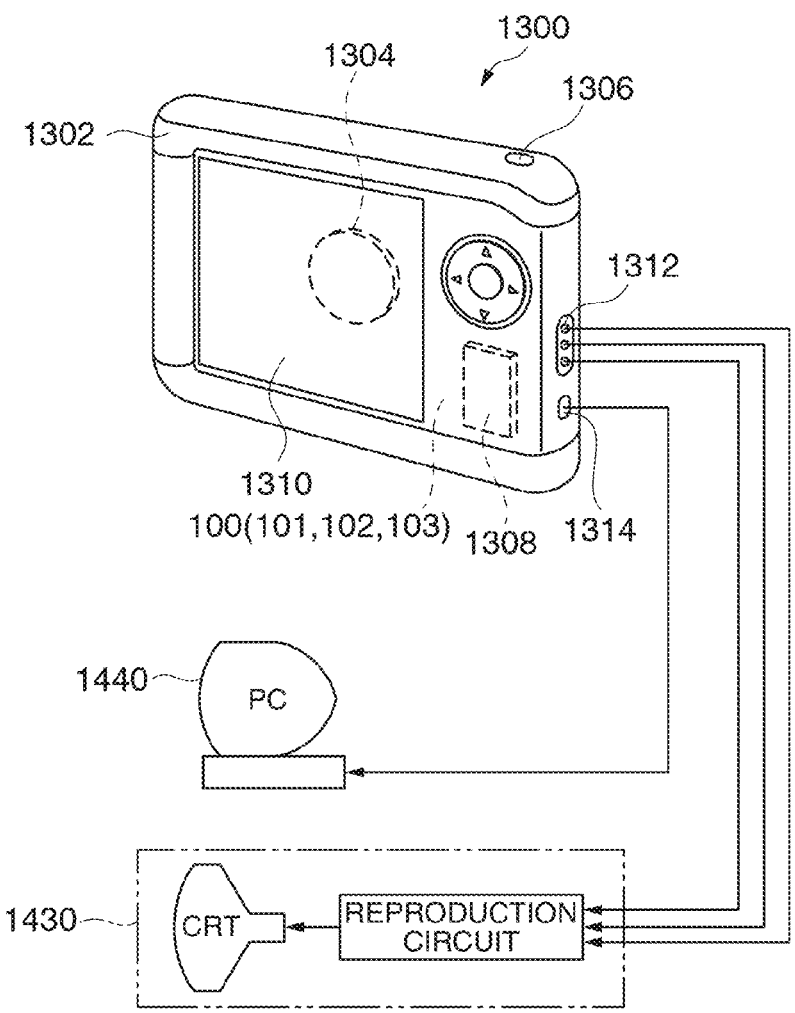
FIG. 19 is a perspective view schematically showing an electronic apparatus.

FIG. 19 is a perspective view schematically showing a digital still camera 1300 as the electronic apparatus according to the embodiment. Moreover, FIG. 19 also shows the connection with external equipment in a simplified manner.

Here, in a general camera, a silver salt photographic film is exposed by the light image of a subject. On the other hand, in the digital still camera 1300, the light image of the subject is photo-electrically converted by an imaging element such as Charge Coupled Device (CCD), and imaging signals (image signals) are generated.

A display portion 1310 is provided on the rear surface of a case (body) 1302 in the digital still camera 1300 and configured so as to perform display based on imaging signals by the CCD, and the display portion 1310 functions as a finder which displays the subject as electronic images.

In addition, a light receiving unit 1304, which includes optical lenses (an imaging optical system), the CCD, and the like, is provided on the front surface side (the rear surface side in the drawing) of the case 1302.

If a photographer confirms the subject image which is displayed on the display portion 1310 and presses a shutter button 1306, the imaging signals of the CCD at that time is transmitted and stored to a memory 1308.

Moreover, in the digital still camera 1300, a video signal output terminal 1312 and an input and output terminal for data communication 1314 are provided on the side surface of the case 1302. In addition, if necessary, a television monitor 1430 is connected to the video signal output terminal 1312 and a personal computer 1440 is connected to the input and output terminal for data communication 1314. Moreover, the imaging signals which are stored in the memory 1308 are output to the television monitor 1430 or the personal computer 1440 according to a predetermined operation.

The electronic device 100 is built in the above-described digital still camera 1300.

The above-described electronic apparatuses 1100, 1200, and 1300 can include the electronic device 100 having improved reliability.

Moreover, for example, the electronic apparatus which includes the above-described electronic device 100 (or any one of 101, 102, and 103) may be applied to an ink jet type ejecting apparatus (for example, an ink jet printer), a laptop type personal computer, a television, a video camera, a video tape recorder, various navigation apparatuses, a pager, an electronic organizer (with a communication function), an electronic dictionary, an electronic calculator, an electronic game machine, a head mount display, a word processor, a work station, a videophone, a television monitor for crime prevention, an electronic binoculars, a POS terminal, a medical device (for example, an electronic thermometer, a sphygmomanometer, a blood sugar meter, an electrocardiogram measurement device, ultrasonic diagnostic device, an electronic endoscope), a fish-finder, a various measurement devices, meters (for example, meters of a vehicle, an airplane, a rocket, and a ship), an attitude control of a robot, a human body, or the like, a flight simulator, or the like, in addition to the personal computer (mobile type personal computer)

shown in FIG. 17, the portable phone shown in FIG. 18, and the digital still camera shown in FIG. 19.

4. Moving Body

Figure 20:
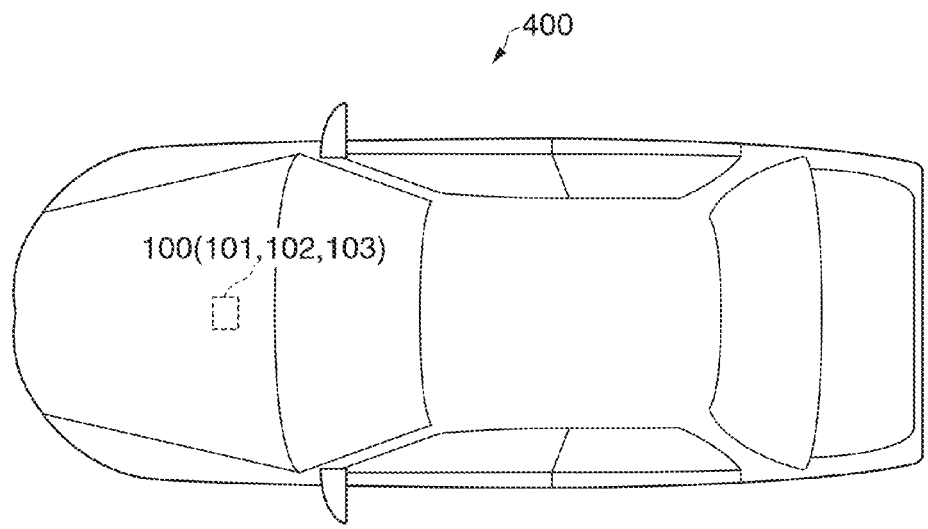
FIG. 20 is a top view schematically showing a moving body.

FIG. 20 is a view (a top view) showing an example of a moving body of the embodiment. A moving body 400 shown in FIG. 20 is configured so as to include the electronic device 100 (or any one of 101, 102, and 103) according to the embodiment of the invention. Moreover, the moving body of the embodiment may be configured so as to omit or modify a portion of components (each portion) of FIG. 20, and to add other components.

In the above-described moving body 400, a plurality of physical quantity sensors such as a gyro sensor or an acceleration sensor are mounted on a navigation system or the like and perform controls which are required in the movement of the moving body, and thus, high reliability is needed.

As the electronic device for the moving body, the electronic device 100 (or any one of 101, 102, and 103) of the above-described each embodiment is applied, and thus, high reliability can be secured.

As the above-described moving body 400, various moving bodies are considered, and for example, there are an automobile (which also includes an electric automobile), an airplane such as a jet plane or helicopter, a ship, a rocket, an artificial satellite, or the like.

The above-described embodiments and Modification Examples are examples and are not limited thereto. For example, each embodiment and each Modification Example may be appropriately combined.

The invention includes configurations which are substantially the same as the configurations described in the embodiments (for example, the configurations in which the function, the method, and the results are the same, or the configurations in which the object and the effects are the same). Moreover, the invention includes configurations in which no essential portions of configurations described in the embodiments are replaced. In addition, the invention includes configurations which express the same effects as the configurations described in the embodiments, or configurations in which the same object as the configurations described in the embodiments can be achieved. Moreover, the invention includes configurations in which known technologies are added to the configurations described in the embodiments.

The entire disclosure of Japanese Patent Application Nos. 2012-085863, filed Apr. 4, 2012 and 2013-028186, filed Feb. 15, 2013 are expressly incorporated by reference herein.

What is claimed is:

1. An electronic device comprising:
a substrate;
a cover body which is placed above the substrate, the cover body having a cover top surface and a cover bottom surface opposite to the cover top surface;
a first function element which is provided in a first cavity which is formed by the substrate and the cover body; and
a second function element which is provided in a second cavity which is formed by the substrate and the cover body,
wherein an inner portion of the first cavity is sealed in a first air pressure atmosphere, and an inner portion of the second cavity is sealed in a second air pressure atmosphere which has a difference of air pressure with respect to the first air pressure atmosphere,
a first through-hole, which communicates with the first cavity and is blocked by a seal member, is provided in the cover body, the first through-hole has a through-hole bottom surface, and the through-hole bottom surface is parallel to the cover top surface, a communication hole is provided at the through-hole bottom surface, the first through-hole communicates with the first cavity via the communication hole, and the through-hole bottom surface is located between the cover top surface and the cover bottom surface so that the through-hole bottom surface is spaced apart from the cover bottom surface in a cross sectional view, and the first cavity and the second cavity are isolated from each other by a partition wall portion which is integrally provided to the cover body or the substrate.

2. The electronic device according to claim 1,
wherein a second through-hole, which communicates with the second cavity and is blocked by a seal member, is provided in at least one of the substrate and the cover body.

3. The electronic device according to claim 2,
wherein the first through-hole and the second through-hole do not overlap with the first function element and the second function element in a plan view of the electronic device.

4. A portable phone comprising the electronic device according to claim 3.

5. A portable phone comprising the electronic device according to claim 2.

6. An automobile comprising the electronic device according to claim 2.

7. The electronic device according to claim 1,
wherein the first through-hole does not overlap with the first function element and the second function element in a plan view of the electronic device.

8. A portable phone comprising the electronic device according to claim 7.

9. An automobile comprising the electronic device according to claim 7.

10. The electronic device according to claim 1,
wherein a material of the substrate is glass and a material of the cover body is silicon.

11. The electronic device according to claim 1,
wherein the first function element detects physical quantities different from the second function element.

12. A portable phone comprising the electronic device according to claim 1.

13. An automobile comprising the electronic device according to claim 1.

14. A manufacturing method of an electronic device, comprising:
placing a first function element and a second function element above a substrate;
placing a cover body on the substrate, accommodating the first function element in a first cavity which is formed by the substrate and the cover body, and accommodating the second function element in a second cavity which is formed by the substrate and the cover body, the cover body having a cover top surface and a cover bottom surface opposite to the cover top surface; and
sealing the first cavity in a first air pressure atmosphere and sealing the second cavity in a second air pressure atmosphere which has a difference of air pressure with respect to the first air pressure atmosphere,
wherein the first cavity and the second cavity are isolated from each other by a partition wall portion which is integrally provided to the cover body or the substrate,
wherein a first through-hole is provided in the cover body, the first through-hole has a through-hole bottom surface, and the through-hole bottom surface is parallel to the cover top surface, and wherein a communication hole is provided at the through-hole bottom surface, the first through-hole communicates with the first cavity via the communication hole, and the through-hole bottom surface is located between the cover top surface and the cover bottom surface so that the through-hole bottom surface is spaced apart from the cover bottom surface in a cross sectional view.

15. The manufacturing method of an electronic device according to claim 14,
wherein a second through-hole which communicates with the second cavity is provided in at least one of the substrate and the cover body,
the sealing includes a first sealing of sealing the first cavity by blocking the first through-hole by a seal member in the first air pressure atmosphere, and a second sealing of sealing the second cavity by blocking the second through-hole by a seal member in the second air pressure atmosphere after the first sealing, and
the first air pressure atmosphere is air pressure lower than the second air pressure atmosphere.

16. The manufacturing method of an electronic device according to claim 14,
wherein
the sealing includes a first sealing of sealing the second cavity in the second air pressure atmosphere by performing the placing and the accommodating in the second air pressure atmosphere, and a second sealing of sealing the first cavity by blocking the first through-hole by the seal member in the first air pressure atmosphere after the first sealing.

17. The manufacturing method of an electronic device according to claim 16,
wherein the second air pressure atmosphere is air pressure lower than the first air pressure atmosphere.

18. The manufacturing method of an electronic device according to claim 16,
wherein the second air pressure atmosphere is air pressure higher than the first air pressure atmosphere.

19. The manufacturing method of an electronic device according to claim 14,
wherein a material of the substrate is glass and a material of the cover body is silicon.

20. The manufacturing method of an electronic device according to claim 14,
wherein the first function element detects physical quantities different from the second function element.

* * * * *